United States Patent
Yang et al.

(10) Patent No.: US 9,416,273 B1
(45) Date of Patent: Aug. 16, 2016

(54) CURABLE COMPOSITION AND METHOD FOR MANUFACTURING THE SAME

(71) Applicant: ETERNAL MATERIALS CO., LTD., Kaohsiung (TW)

(72) Inventors: Chih Chiang Yang, Kaohsiung (TW); Hsien Fan Chen, Kaohsiung (TW); Feng Yi Wang, Kaohsiung (TW); Jun Nan Yang, Kaohsiung (TW)

(73) Assignee: ETERNAL MATERIALS CO., LTD., Kaohsiung (TW)

( * ) Notice: Subject to any disclaimer, the term of this patent is extended or adjusted under 35 U.S.C. 154(b) by 0 days.

(21) Appl. No.: 14/700,358

(22) Filed: Apr. 30, 2015

(51) Int. Cl.
*C08L 83/06* (2006.01)
*H01L 33/56* (2010.01)
*H01L 31/0203* (2014.01)

(52) U.S. Cl.
CPC .............. *C08L 83/06* (2013.01); *H01L 31/0203* (2013.01); *H01L 33/56* (2013.01)

(58) Field of Classification Search
None
See application file for complete search history.

(56) References Cited

U.S. PATENT DOCUMENTS

| | | | | |
|---|---|---|---|---|
| 3,269,983 A * | 8/1966 | Holbrook | ................ | C08G 77/50 525/477 |
| 3,553,164 A * | 1/1971 | Curry | ..................... | C08G 77/50 522/172 |
| 4,886,865 A * | 12/1989 | Ikeno | ..................... | C08G 77/50 525/478 |
| 5,087,720 A * | 2/1992 | Kishita | .................. | C08G 77/50 556/434 |
| 5,340,899 A * | 8/1994 | Altes | ..................... | C08G 77/50 524/731 |
| 6,492,480 B1 * | 12/2002 | Nagashima | ............ | C08G 77/50 502/161 |
| 7,527,871 B2 | 5/2009 | Morita et al. | | |
| 7,615,387 B2 * | 11/2009 | Miyoshi | ................ | C09J 183/04 428/447 |
| 8,748,533 B2 * | 6/2014 | Liang | ..................... | C08L 83/04 525/35 |

FOREIGN PATENT DOCUMENTS

JP 8-176447 A 7/1996
JP 2003-128922 A 5/2003

OTHER PUBLICATIONS espacenet English abstract of JP 8-176447 A.
espacenet English abstract of JP 2003-128922 A.

* cited by examiner

*Primary Examiner* — Robert S Loewe
(74) *Attorney, Agent, or Firm* — Ladas & Parry LLP

(57) ABSTRACT

A curable composition includes the following: (A) a polymer having an average unit formula (I'): $[(R'')_2SiO_{2/2}]_{a''}[(CH_2=CH)(R'')_2SiO_{1/2}]_{b''}[R''SiO_{3/2}]_{c''}[O_{1/2}Si(R'')_2(CH_2CH_2)(R'')_2SiO_{1/2}]_{e''}$; (B) a branched organopolysiloxane having an average unit formula (VI) $(R^4SiO_{3/2})_x(SiO_{4/2})_y[(R^8)_3SiO_{1/2}]_{1-x-y}$; (C) an organopolysiloxane having an average unit formula (II) being capped with H: $(R^5_2SiO_{2/2})_f(R^6_3SiO_{1/2})_g(R^7SiO_{3/2})_h(SiO_{4/2})_i(CH_2CH_2)_j$; and (D) a catalyst, wherein R'', $R^4$ to $R^8$, x, y, a'' to c'', e'' and f to j are as defined in the specification.

31 Claims, No Drawings

CURABLE COMPOSITION AND METHOD FOR MANUFACTURING THE SAME

BACKGROUND OF THE INVENTION

1. Field of the Invention

The present invention relates to a curable composition. In particular, the present invention relates to a curable composition, which is suitable for use as the packaging material of electronic components such as light emitting diodes.

2. Descriptions of the Related Art

Organic resin, due to its properties of high processability, light weight, low cost and impact resistance etc., has gradually replaced inorganic glass for use as optical components such as optical lens and packaging materials of electronic components. Recently, due to the development of light emitting diode techniques (e.g., high brightness, multiple color property etc.), organic silicon resins which have better heat resistance, water resistance and transparency, have gradually replaced epoxy resins for use as the packaging material of electronic components.

An organic silicon resin, such as organopolysiloxane, can be cured through alkylation with silicon hydrides. The cured solid product of the alkylation has a high refractive index and transmittance, and can be used as the packaging material of a light emitting diode. For example, JP H8-176447 discloses a curable organopolysiloxane composition, comprising an organopolysiloxane in which each molecule has a silicon-bonded phenyl group and an silicon-bonded alkenyl group, an organic hydrogen siloxane, and an addition catalyst; and JP 2003-128922 discloses a curable organopolysiloxane composition, comprising an organopolysiloxane in which each molecule has at least two silicon-bonded alkenyl groups and a silicon-bonded phenyl group, an organopolysiloxane in which each molecule has at least two silicon-bonded H, and an addition catalyst. Such curable organopolysiloxane compositions, due to their high viscosities, have disadvantages including operation difficulty and poor adhesive property to the substrate.

U.S. Pat. No. 7,527,871 B2 discloses a modified curable organopolysiloxane composition, in comparison to the above prior arts, which comprises a component of a linear organopolysiloxane with at least two silicon-bonded alkenyl groups and at least one aryl group and thus, can provide a cured product with a low viscosity and well adhesive property. However, during the synthesis of the above component, a great amount of nonreactive residue of methyl phenyl rings is inevitably generated for the reaction equilibrium, which will make the surface of the cured product obtained from the composition sticky. In addition, any procedure used to remove the rings, such as a high-temperature distillation, will probably lead to the breakage of the bonding between the phenyl groups and result in the appearance of yellowing. Furthermore, since the added component is a linear organopolysiloxane with insufficient strength, the cured product will tend to fracture under a high temperature or a drastic temperature variation.

In general, to achieve higher transmittance and superior water resistance and gas resistance, the packaging industry tends to adjust the content of the aromatic groups so as to increase the refractive index (i.e. >1.5) of packaging materials. However, the increase of the refractive index results in poor heat resistance of the packaging materials such that the packaging materials will yellow when exposed to high temperature. Therefore, such packaging materials are not suitable for high-power semiconductor devices. If the packaging materials are adjusted to have a lower refractive index (i.e. <1.43), although the heat resistance of the packaging materials can be improved, the water resistance and gas resistance will be decreased and transmittance will also be sacrificed. Accordingly, a packaging material simultaneously having high transmittance, superior water resistance and gas resistance and improved heat resistance is in high demand in the industry.

In view of the above, the present invention provides a curable composition without any undesired residue of rings produced during the manufacturing process. The cured product of the composition has outstanding heat resistance, transmittance, water resistance and gas resistance, and barely yellows when exposed to high temperature. In addition, the ratio or structure of the components contained in the curable composition can be adjusted to satisfy the demands of a quick curing process and to provide the desired properties including superior transmittance, heat resistance, water resistance, gas resistance and surface conditions.

SUMMARY OF THE INVENTION

An objective of the present invention is to provide a curable composition comprising:

(A) a polymer having an average unit formula (I'):

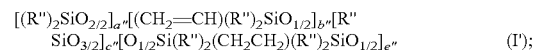

$$[(R'')_2SiO_{2/2}]_{a''}[(CH_2=CH)(R'')_2SiO_{1/2}]_{b''}[R''SiO_{3/2}]_{c''}[O_{1/2}Si(R'')_2(CH_2CH_2)(R'')_2SiO_{1/2}]_{e''} \quad (I');$$

wherein R'' is a substituted or unsubstituted mono-valent hydrocarbon group and each of R'' is the same with or different from each other; a'' is an integer ranging from 0 to 400; b'' is an integer ranging from 2 to 6; c'' is an integer ranging from 0 to 4, and e'' is an integer ranging from 2 to 400;

(B) a branched organopolysiloxane having an average unit formula (VI):

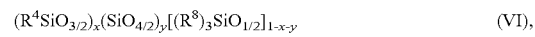

$$(R^4SiO_{3/2})_x(SiO_{4/2})_y[(R^8)_3SiO_{1/2}]_{1-x-y} \quad (VI),$$

wherein $R^4$ is a substituted or unsubstituted mono-valent hydrocarbon group and each of $R^4$ is the same with or different from each other; $R^8$ is a substituted or unsubstituted mono-valent hydrocarbon group and each of $R^8$ is the same with or different from each other; x>0, y>0 and x+y is from about 0.35 to about 0.7, wherein about 0.1 mol % to about 40 mol % of $R^8$ is $C_2$-$C_8$ alkenyl, based on the total amount of all silicon-bonded organic functional groups (which indicates the total amount of $R^4$ and $R^8$); and wherein the amount of component (B) is about 1 part by weight to about 9,900 parts by weight, based on 100 parts by weight of component (A);

(C) an organopolysiloxane having an average unit formula (II) being capped with H:

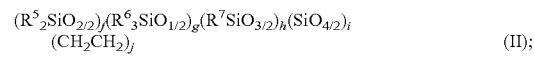

$$(R^5{}_2SiO_{2/2})_f(R^6{}_3SiO_{1/2})_g(R^7SiO_{3/2})_h(SiO_{4/2})_i(CH_2CH_2)_j \quad (II);$$

wherein $R^5$, $R^6$ and $R^7$ are independently H or a substituted or unsubstituted mono-valent hydrocarbon group, each of $R^5$ is the same with or different from each other, each of $R^6$ is the same with or different from each other, each of $R^7$ is the same with or different from each other, f>0, g>0, h≥0, i≥0, j≥0, and the amount of component (C) is about 1 parts by weight to about 250 parts by weight, based on 100 parts by weight of the total amount of components (A) and (B); and (D) a catalyst.

Another objective of the present invention is to provide a method for manufacturing the above curable composition, comprising performing an addition reaction of a siloxane having at least two alkenyl groups and a siloxane having at least two H to provide component (A).

The above curable composition according to the invention can be used as the packaging material of a light emitting diode.

Further objective of the present invention is to provide a phosphor package, which comprises a phosphor material and a silicone material, wherein the silicone material is a cured product of the aforementioned curable composition.

The detailed technology and preferred embodiments implemented for the subject invention are described in the following paragraphs for people skilled in this field to well appreciate the features of the claimed invention.

DETAILED DESCRIPTION

Hereinafter, some embodiments of the present invention will be described in detail. However, the present invention may also be practiced in various different forms without departing from the spirits of the present invention. The scope of the present invention shall not be considered to be limited to what is illustrated herein. In addition, unless it is additionally explained, the expressions "a," "the," or the like recited in the specification (especially in the claims) should include the singular and the plural forms. Furthermore, unless it is additionally explained, the groups (e.g., a mono-valent hydrocarbon group, an alkyl group, an aryl group and an alkenyl group) recited in the specification should include substituted or unsubstituted groups.

The term "mono-valent hydrocarbon group" used herein indicates substituted or unsubstituted $C_1$-$C_{20}$ alkyl, preferably substituted or unsubstituted $C_1$-$C_{12}$ alkyl, and more preferably substituted or unsubstituted $C_1$-$C_8$ alkyl, for example, but not limited to methyl, ethyl, propyl, butyl, pentyl, hexyl or heptyl; substituted or unsubstituted $C_2$-$C_{20}$ alkenyl, preferably substituted or unsubstituted $C_2$-$C_{12}$ alkenyl, more preferably substituted or unsubstituted $C_2$-$C_6$ alkenyl, for example, but not limited to vinyl, allyl, butenyl, pentenyl or hexenyl; substituted or unsubstituted $C_6$-$C_{14}$ aryl, for example, but not limited to phenyl, tolyl, xylyl or naphthyl; $C_7$-$C_{15}$ arylalkyl, for example, but not limited to benzyl or phenylethyl; or $C_1$-$C_{20}$ haloalkyl, preferably $C_1$-$C_{12}$ haloalkyl, more preferably $C_1$-$C_8$ haloalkyl, for example, but not limited to 3-chloropropyl group or 3,3,3-trifluoropropyl group.

One feature of the curable composition of the invention is the use of component (A). There is no residue of rings with low molecular weight, such as methyl phenyl rings, produced during the preparation of component (A); therefore, the cured product of the curable composition of the invention has the advantage of including an unsticky surface and rarely yellows when being cured at a high temperature.

Specifically, the curable composition of the invention comprises:

(A) a polymer having an average unit formula (I'):

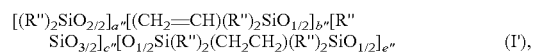

(I'), wherein R″ is a substituted or unsubstituted mono-valent hydrocarbon group and each of R″ is the same with or different from each other; a″ is an integer ranging from 0 to 400; b″ is an integer ranging from 2 to 6; c″ is an integer ranging from 0 to 4, and e″ is an integer ranging from 2 to 400;

(B) a branched organopolysiloxane having an average unit formula (VI):

$$(R^4SiO_{3/2})_x(SiO_{4/2})_y[(R^8)_3SiO_{1/2}]_{1-x-y}$$ (VI), wherein $R^4$ is a substituted or unsubstituted mono-valent hydrocarbon group and each of $R^4$ is the same with or different from each other; $R^8$ is a substituted or unsubstituted mono-valent hydrocarbon group and each of $R^8$ is the same with or different from each other; x>0, y>0 and x+y is from about 0.35 to about 0.7, wherein about 0.1 mol % to about 40 mol % of $R^8$ is $C_2$-$C_8$ alkenyl, based on the total amount of all silicon-bonded organic functional groups (which indicates the total amount of $R^4$ and $R^8$); and wherein the amount of component (B) is about 1 part by weight to about 9,900 parts by weight, based on 100 parts by weight of component (A);

(C) an organopolysiloxane having an average unit formula (II) being capped with H:

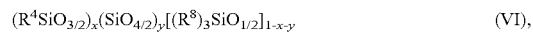

(II);

wherein $R^5$, $R^6$ and $R^7$ are independently H or a substituted or unsubstituted mono-valent hydrocarbon group, each of $R^5$ is the same or different from each other, each of $R^6$ is the same or different from each other, each of $R^7$ is the same with or different from each other, f>0, g>0, h≥0, i≥0, j≥0, and the amount of component (C) is about 1 parts by weight to about 250 parts by weight, based on 100 parts by weight of the total amount of components (A) and (B); and (D) a catalyst.

The polymer of the component (A) is in liquid phase at room temperature (about 25° C.) and has a viscosity of 10 to 100,000 mPa·s. R″ is preferably $C_1$-$C_3$ alkyl or aryl, more preferably methyl or phenyl and each of R″ is the same with or different from each other. More preferably, about 0 to about 30 mol % of R″ is aryl (based on the total amount of R″). a″ is an integer ranging from 0 to 400, preferably from 1 to 150, more preferably from 9 to 140; b″ is an integer ranging from 2 to 6, preferably from 3 to 5; c″ is an integer ranging from 0 to 4, preferably from 1 to 3; and e″ is an integer ranging from 2 to 400, preferably from 3 to 150, more preferably from 4 to 140.

More preferably, component (A) may be the polymer selected from the following:

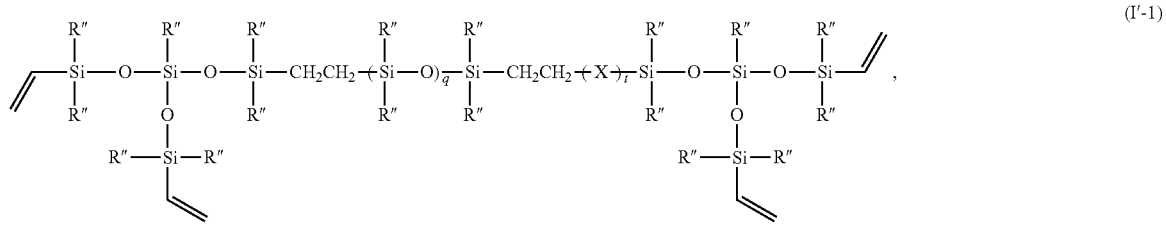

(I'-1)

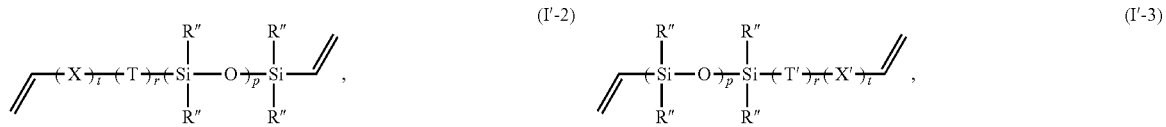

(I'-2)

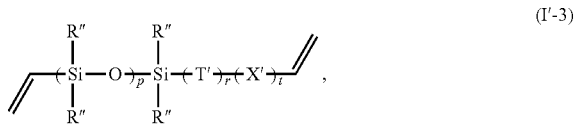

(I'-3)

-continued

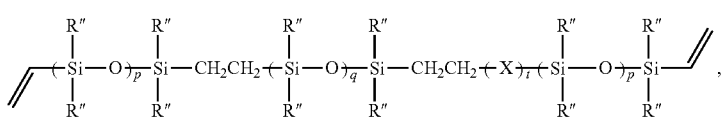
(I'-4)

and a combination thereof,
wherein
X is

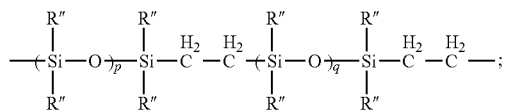

X' is

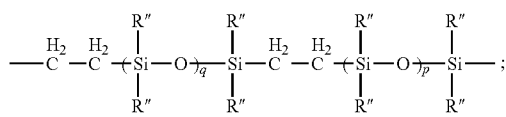

T is

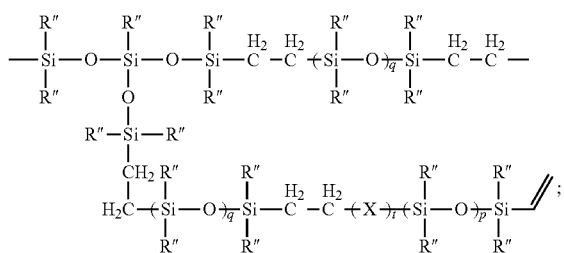

T' is

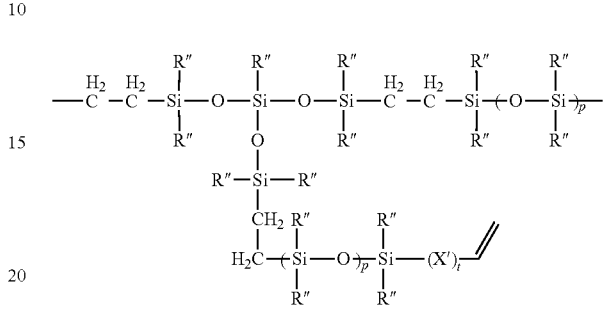

R" is as defined above;

p is an integer ranging from 1 to 4 and each of p is the same with or different from each other;

q is an integer ranging from 1 to 4 and each of q is the same with or different from each other;

r is an integer ranging from 1 to 3 and each of r is the same with or different from each other, preferably r is 1; and t is an integer ranging from 0 to 50, preferably an integer ranging from 1 to 30, and each of t is the same with or different from each other.

The repeated units, X, T, X' and T' can be distributed in a random manner or in an alternative manner. Each X, T, X' and T' is independent and may have the same or different definition.

More preferably, component (A) is:

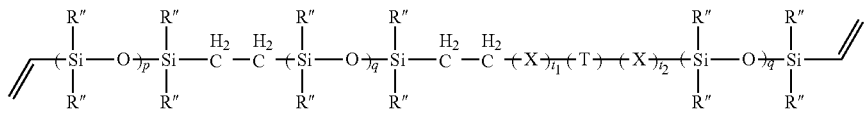

wherein X, T, R", p and q are as defined above, $t_1$ and $t_2$ are independently an integer ranging from 0 to 30, preferably from 3 to 25, more preferably 5 to 20, and $t_1+t_2$ is an integer ranging from 0 to 50, preferably an integer ranging from 8 to 40, more preferably an integer ranging from 10 to 35.

Specifically, component (A) is a polymer selected from:

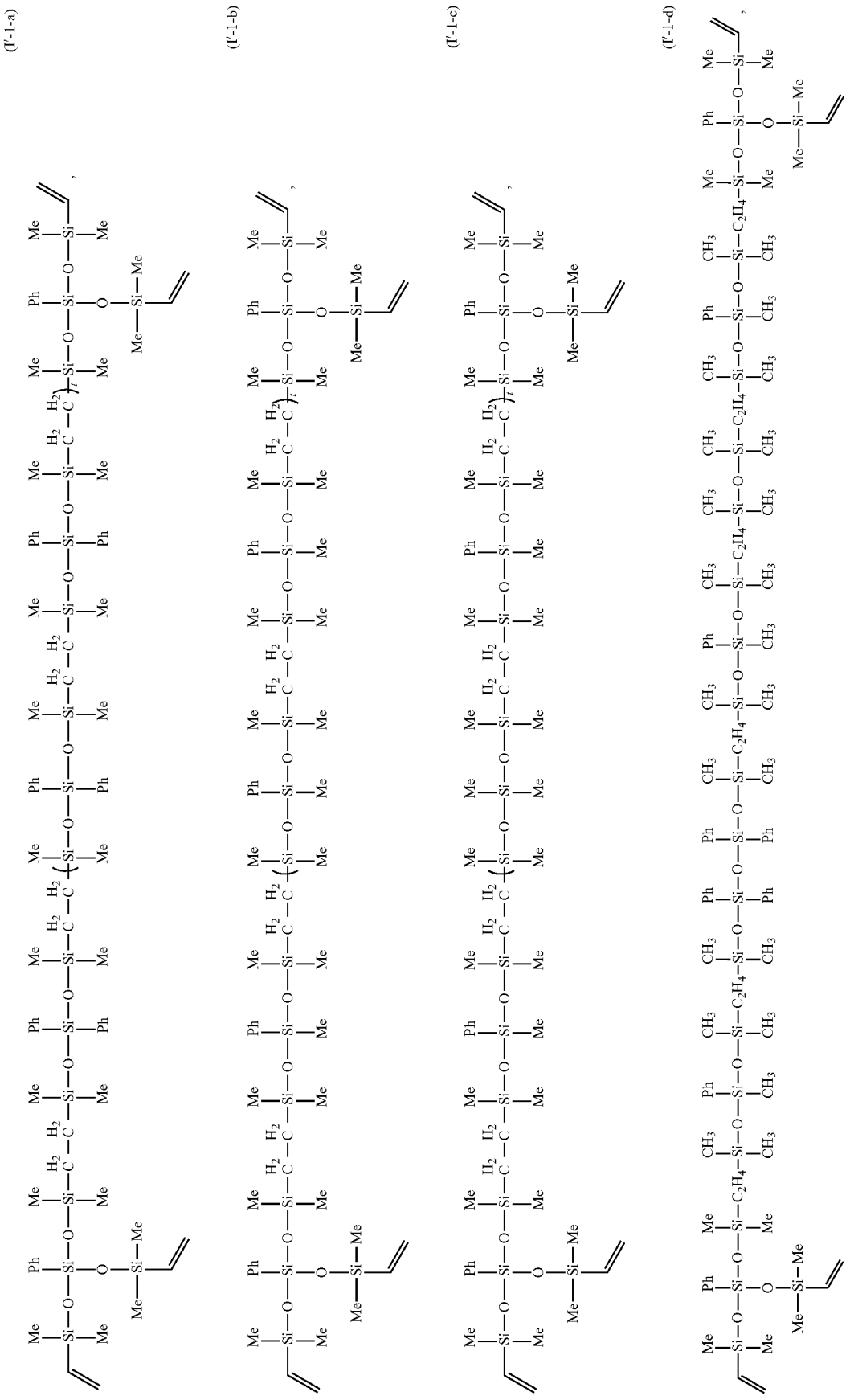

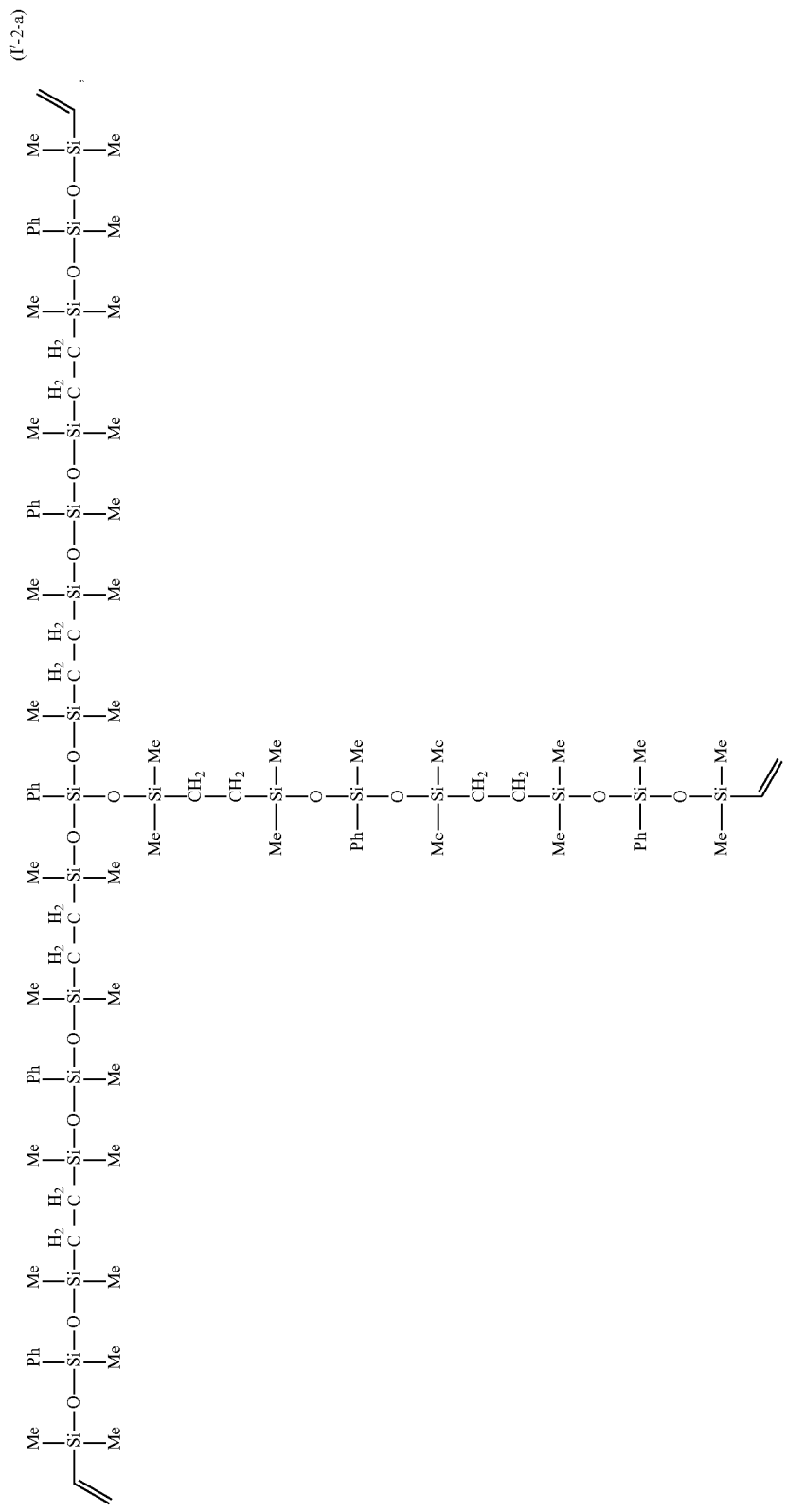

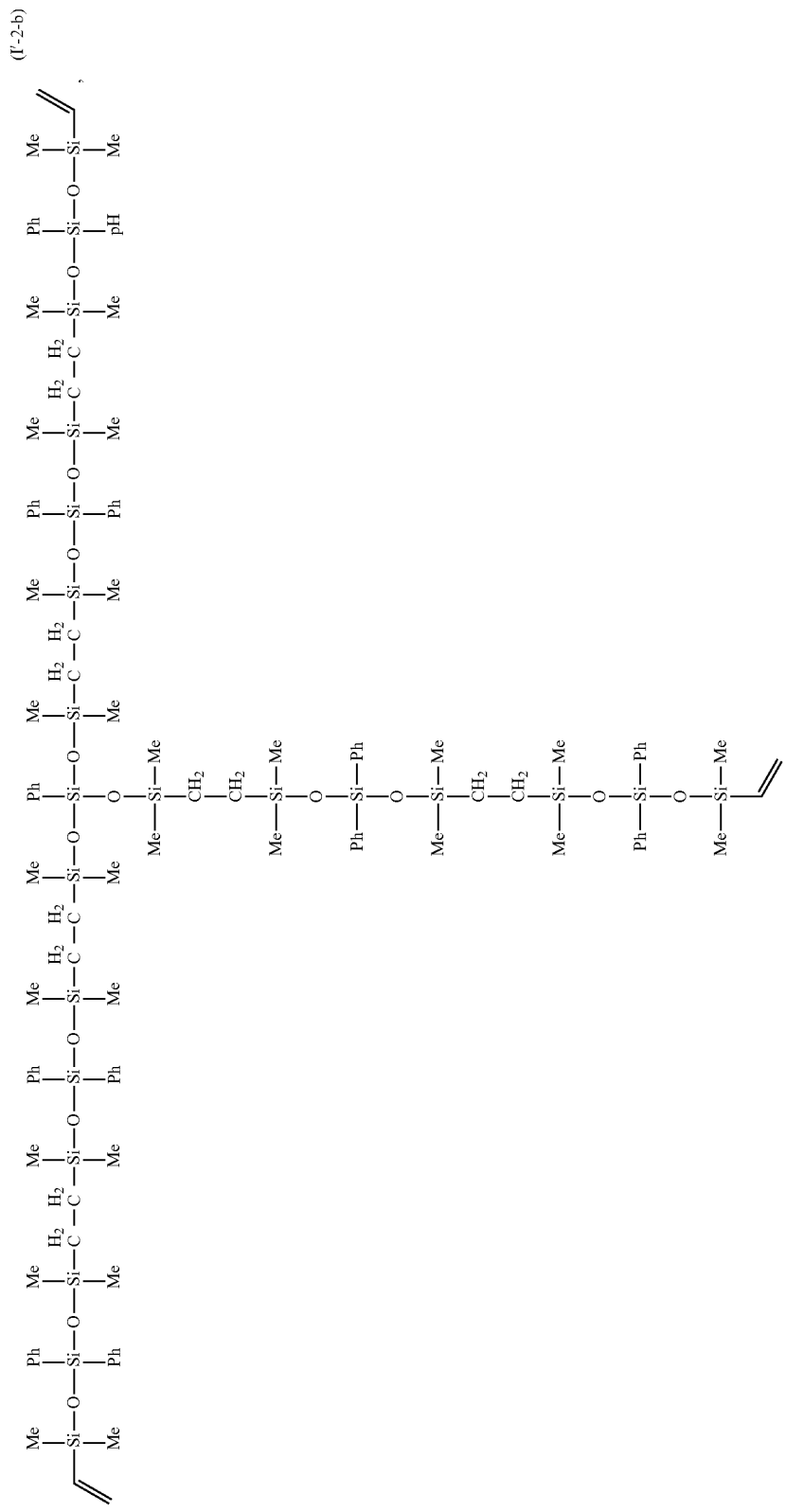

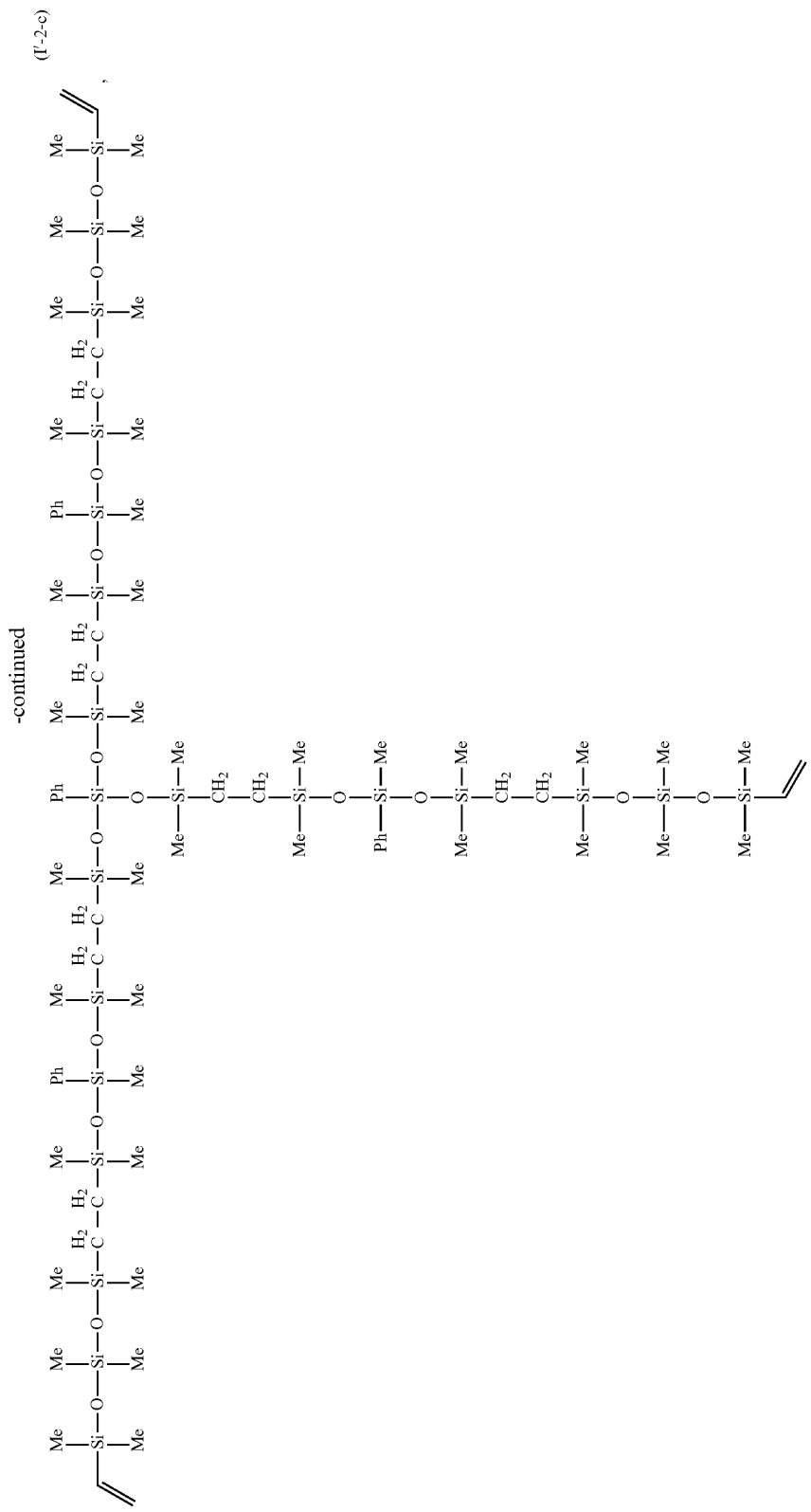

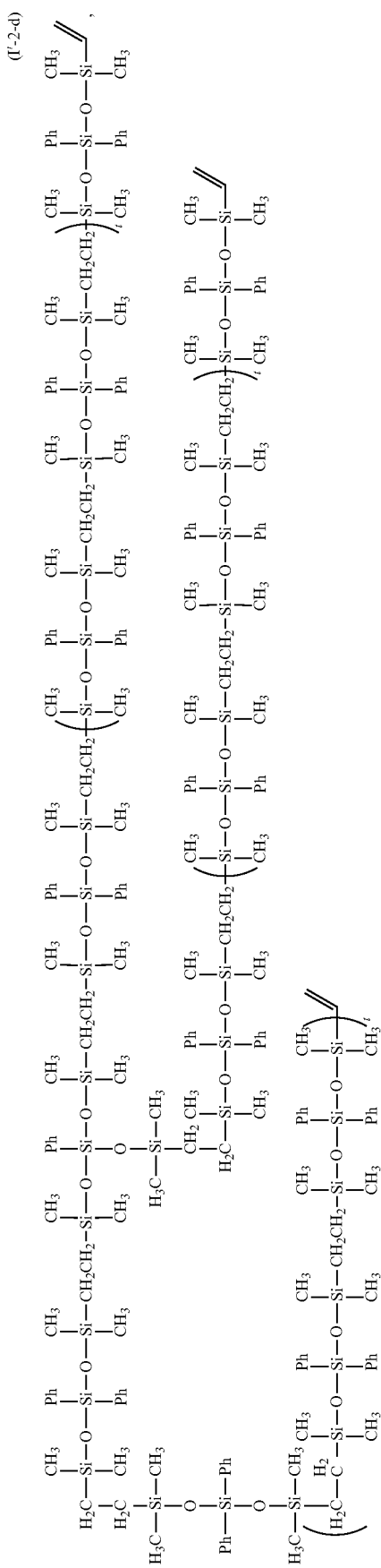

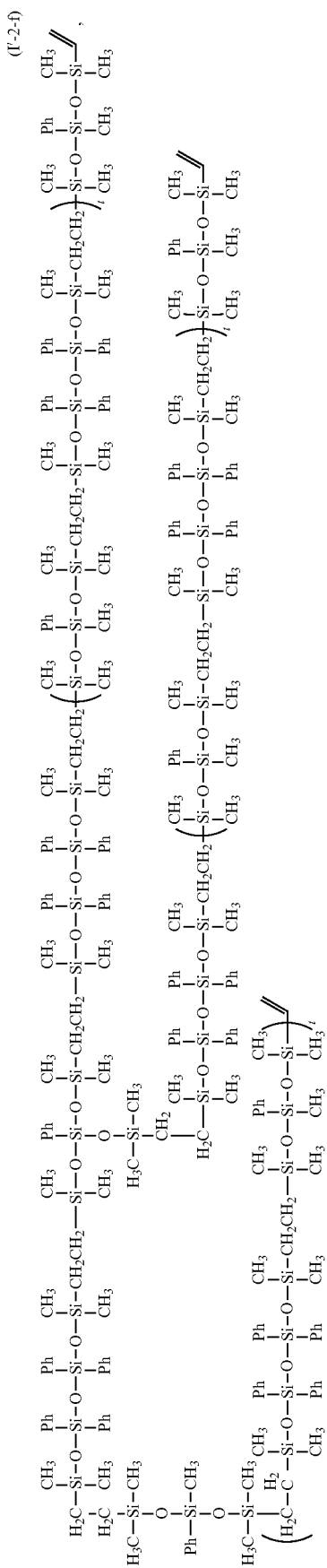

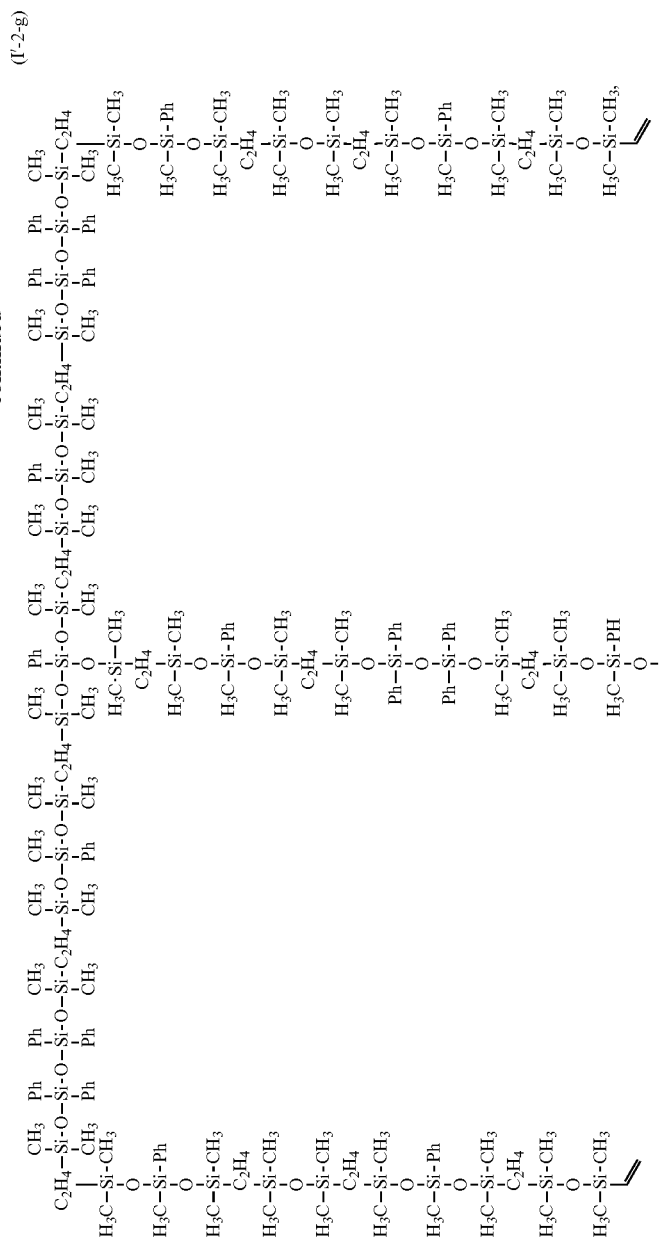
(I'-2-g)

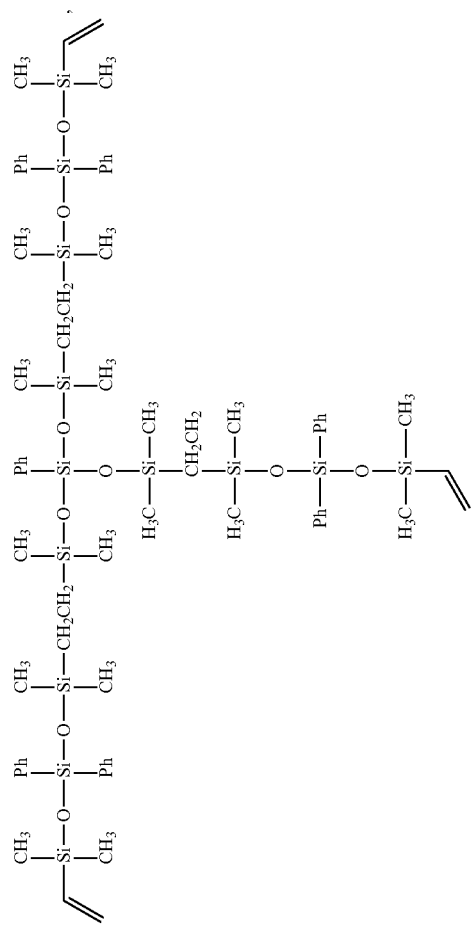
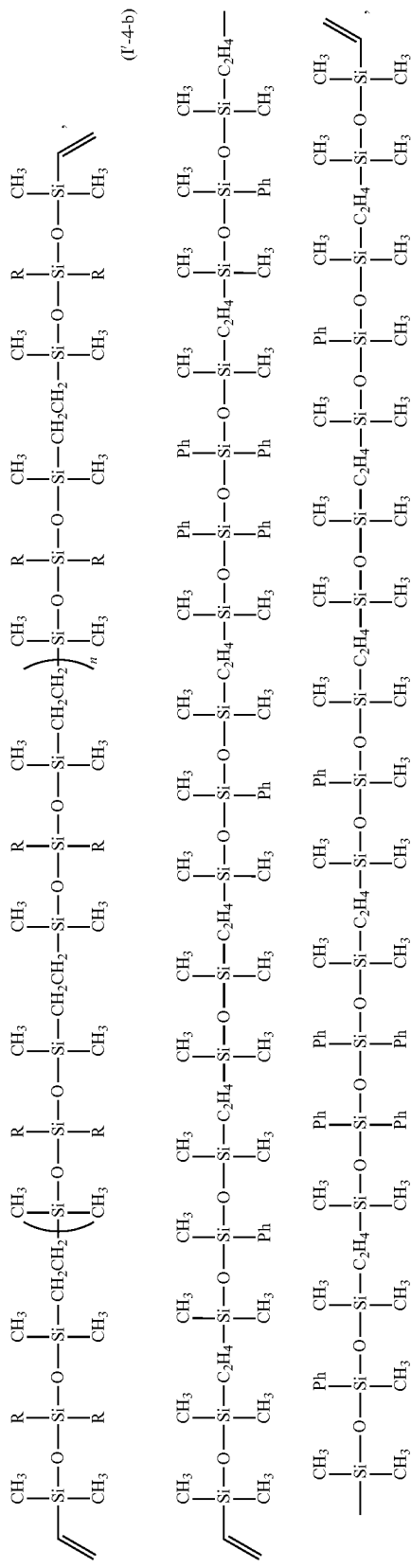

and a combination thereof, wherein t is as defined above, n is independently an integer ranging from about 1 to about 50, preferably from 3 to 30, more preferably from 5 to 20. Further preferably, each R is independently methyl or phenyl.

Preferably, component (A) is a branched polymer having an organopolysiloxane unit and at least three silicon-bonded alkenyl groups as end groups. It was found that an enhanced hardness, heat resistance and tensile strength can be achieved when component (A) is a branched polymer, for example, the branched polymer of the formula (I'-1-a), (I'-1-b), (I'-1-c), (I'-2-a), (I'-2-b), (I'-2-c), (I'-2-d), (I'-2-e), (I'-2-f) or (A-1).

According to the invention, component (A) can be prepared by an addition reaction of a siloxane having at least two alkenyl groups with a siloxane having at least two H. During preparation, there is no residue of rings with low molecular weight such as methyl phenyl rings. Therefore, the cured product of the curable composition of the invention does not have disadvantages caused from the residue of rings with low molecular weight (such as a sticky surface and yellowing) and is thus, very suitable for use as an optical material. The siloxane having at least two alkenyl groups, for example, can be the one having an average unit formula (III):

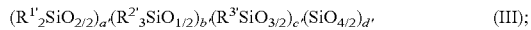(III);

and the siloxane having at least two H can be, for example, one having an average unit formula (IV): (IV),

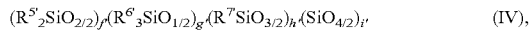(IV), wherein $R^{1'}$, $R^{2'}$, $R^{3'}$, $R^{5'}$, $R^{6'}$ and $R^{7'}$ are independently substituted or unsubstituted mono-valent hydrocarbon groups such as alkyl, alkenyl, aryl, arylalkyl or haloalkyl mentioned above; each $R^{1'}$ is the same as or different from each other; each $R^{2'}$ is the same as or different from each other; each $R^{3'}$ is the same as or different from each other; each $R^{5'}$ is the same as or different from each other; each of $R^{6'}$ is the same as or different from each other; each $R^{7'}$ is the same as or different from each other; and a'>0, b'>0, c'≥0, d'≥0, f'>0, g'>0, h'≥0 and i'≥0.

The structure and/or molecular weight of component (A) can be adjusted by selecting different siloxanes having at least two alkenyl groups or different siloxanes having at least two H. For example, the structure of component (A) (e.g., a linear, branched or reticulated structure) can be adjusted by using a linear or branched siloxane having at least two alkenyl groups and/or a linear or branched siloxane having at least two H. The molecular weight of component (A) can be adjusted by using siloxane having at least two alkenyl groups and/or siloxane having at least two H with different molecular weights, depending on the needs (such as a desired curing rate or mechanical strength).

As to component (A), based on the total amount of R'', preferably about 0.1 mole % to about 40 mole % of R'' are alkenyl groups; and more preferably about 0.3 mole % to about 30 mole % of R'' are alkenyl groups. The reactivity of component (A) with the other components tends to decrease when the content of alkenyl groups is lower than the lower limit of the suggested range or higher than the upper limit of the suggested range. Furthermore, to increase the refractive index of the cured product, preferably at least about 10 mole % of R'' are aryl groups; and more preferably at least about 20 mole % of R'' are aryl groups, based on the total amount of R''.

In some embodiments of the invention, component (A) is prepared by carrying out the addition reaction by using

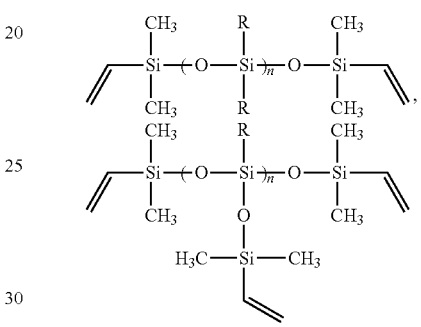

or the like as the siloxane having at least two alkenyl groups (n' is an integer ranging from about 1 to about 5), and using

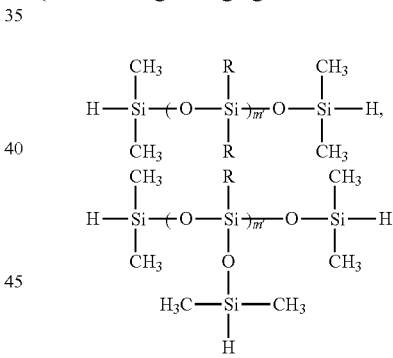

or the like as the siloxane having at least two H (m' is an integer ranging from about 1 to about 5) in a molar ratio of about 2:1 to about 50:49, wherein R has the same definition with R''. For example, component (A)

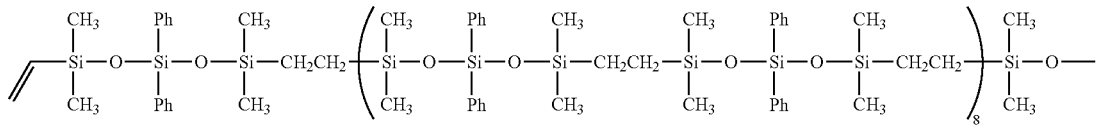

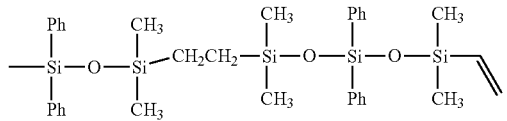

can be prepared by carrying out an addition reaction of $CH_2=CH(CH_3)_2SiO[(C_6H_5)_2Si]OSi(CH_3)_2CH=CH_2$ and $H(CH_3)_2SiO[(C_6H_5)_2Si]OSi(CH_3)_2H$ in a molar ratio of about 10:9.

Component (B) is a branched organopolysiloxane having at least one silicon-bonded alkenyl group and having an average unit formula (VI)

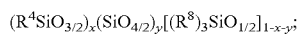

The component (B) is the main component to impart hardness to the cured product obtained from the curable composition of the present invention and also the main component to impart good heat resistance, high transmittance, high water resistance and high gas resistance to the cured product. The alkenyl of the component (B) may be, for example, $C_2$-$C_{20}$ alkenyl, preferably $C_2$ to $C_{12}$ alkenyl, more preferably $C_2$ to $C_6$ alkenyl. Vinyl with a lower molecular weight is much more preferable since vinyl is more stable than other alkenyl group and the reaction using vinyl is easy to be controlled.

In the formula (VI), $R^4$ is a substituted or unsubstituted mono-valent hydrocarbon group and each of $R^4$ is the same with or different from each other; $R^8$ is a substituted or unsubstituted mono-valent hydrocarbon group and each of $R^8$ is the same with or different from each other; wherein about 0.1 mol % to about 40 mol % of $R^8$ is $C_2$-$C_8$ alkenyl, based on the total amount of all silicon-bonded organic functional groups (which indicates the total amount of $R^4$ and $R^8$), preferably about 1 mol % to about 30 mol % of $R^8$ is $C_2$-$C_8$ alkenyl. The reactivity of component (B) with the other components tends to decrease when the content of alkenyl groups is lower than the lower limit of the suggested range or higher than the upper limit of the suggested range. $R^4$ is preferably $C_1$-$C_3$ alkyl, $C_2$-$C_4$ alkenyl, aryl, arylalkyl or haloalkyl, more preferably methyl, phenyl or vinyl. $R^8$ is preferably aryl, $C_1$-$C_3$ alkyl or $C_2$-$C_4$ alkenyl, more preferably phenyl, methyl or vinyl. x>0, y>0 and x+y is from about 0.35 to about 0.7. Preferably, x:y is from about 1:0.3 to about 1:1.5.

In one preferable embodiment of the invention, component (B) has at least one silicon-bonded alkenyl group and at least one silicon-bonded aryl group; wherein about 3 mol % to about 50 mol % of $R^4$ is aryl, based on the total amount of all silicon-bonded organic functional groups (which indicates the total amount of $R^4$ and $R^8$); preferably about 5 mol % to about 40 mol % of $R^4$ is aryl. In such embodiment, the transmittance, water resistance, gas resistance, heat resistance and other properties of the cured product can be enhanced. To achieve a superior reactivity of the composition when cured, in one specific embodiment of the invention, component (B) has an average unit formula (VII):

$R^8$ is $C_1$-$C_8$ alkyl or $C_2$-$C_8$ alkenyl and each of $R^8$ is the same with or different from each other. x>0, y>0 and x+y is from about 0.35 to about 0.7. About 2 mol % to about 30 mol % of $R^8$ is $C_2$-$C_8$ alkenyl, based on the total amount of all silicon-bonded organic functional groups (which indicates the total amount of $R^4$ and $R^8$). Preferably, $R^8$ is $C_1$-$C_3$ alkyl or $C_2$-$C_4$ alkenyl, more preferably is methyl or vinyl.

Among the curable composition of the invention, the amount of component (B) is about 1 part by weight to about 9,900 parts by weight, preferably about 200 part by weight to about 3,000 parts by weight and more preferably about 300 part by weight to about 2,500 parts by weight, based on 100 parts by weight of component (A). The mechanical strength of the cured product of the curable composition is generally insufficient if the amount of component (B) is lower than the lower limit of the suggested range. On the other hand, the cured product of the curable composition will become too hard and its applicability will be limited if the amount of component (B) is higher than the upper limit of the suggested range.

Component (C) is an organopolysiloxane having an average unit formula (II) being capped with H:

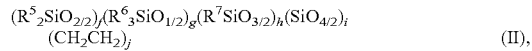

which is the curing agent of the curable composition of the invention, wherein $R^5$, $R^6$ and $R^7$ are independently H or a substituted or unsubstituted mono-valent hydrocarbon group except alkenyl groups, such as alkyl, aryl, arylalkyl, or haloalkyl as mentioned above. Based on the total amount of $R^5$, $R^6$ and $R^7$, preferably about 0.1 mole % to about 50 mole % of $R^5$, $R^6$ and $R^7$ are H and at least about 5 mole % of $R^5$, $R^6$ and $R^7$ are aryl, and more preferably about 5 mole % to about 35 mole % of $R^5$, $R^6$ and $R^7$ are H and at least about 10 mole % of $R^5$, $R^6$ and $R^7$ are aryl.

Furthermore, according to the invention, there is no special limitation to the molecular weight of component (C). However, in view of the viscosity of the whole composition, f, g, h, i and j are preferably as follows:
  f is an integer ranging from about 1 to about 50;
  g is an integer ranging from about 1 to about 50;
  h is an integer ranging from 0 to about 10;
  i is an integer ranging from 0 to about 5; and
  j is an integer ranging from 0 to about 30.
Component (C) may be selected from the following group:

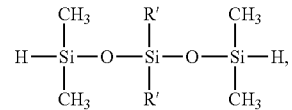

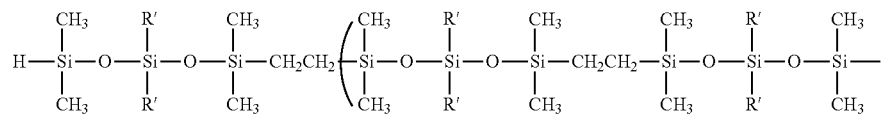

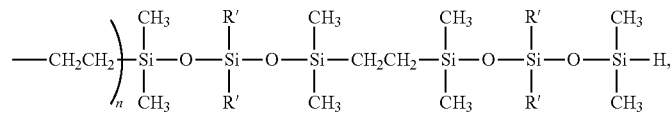

-continued

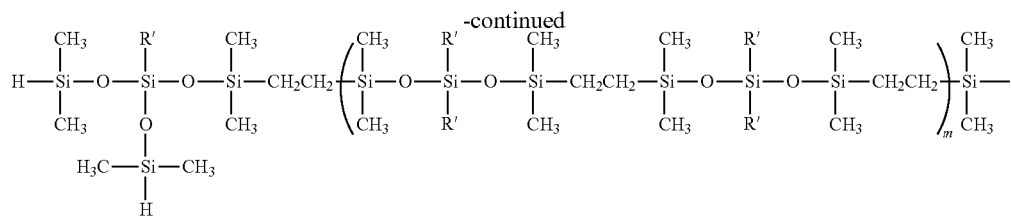

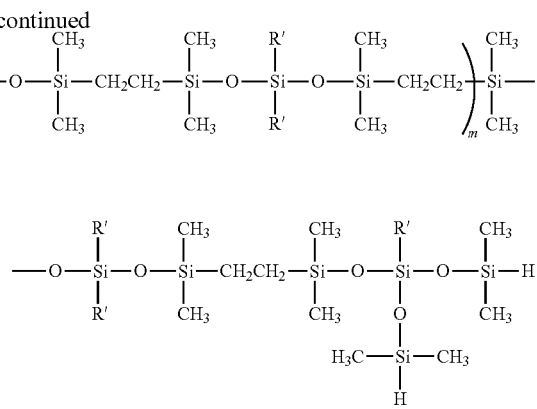

and a combination thereof,
wherein each R' is independently an alkyl group or aryl group, and m" and n" are independently an integer ranging from 0 to about 30; and preferably, each R' is independently $C_1$-$C_8$ alkyl or phenyl, and m" and n" are independently an integer ranging from 0 to about 15.

In some embodiments of the invention, component (C) is $H(CH_3)_2SiO[(Ph)_2Si]OSi(CH_3)_2H$,

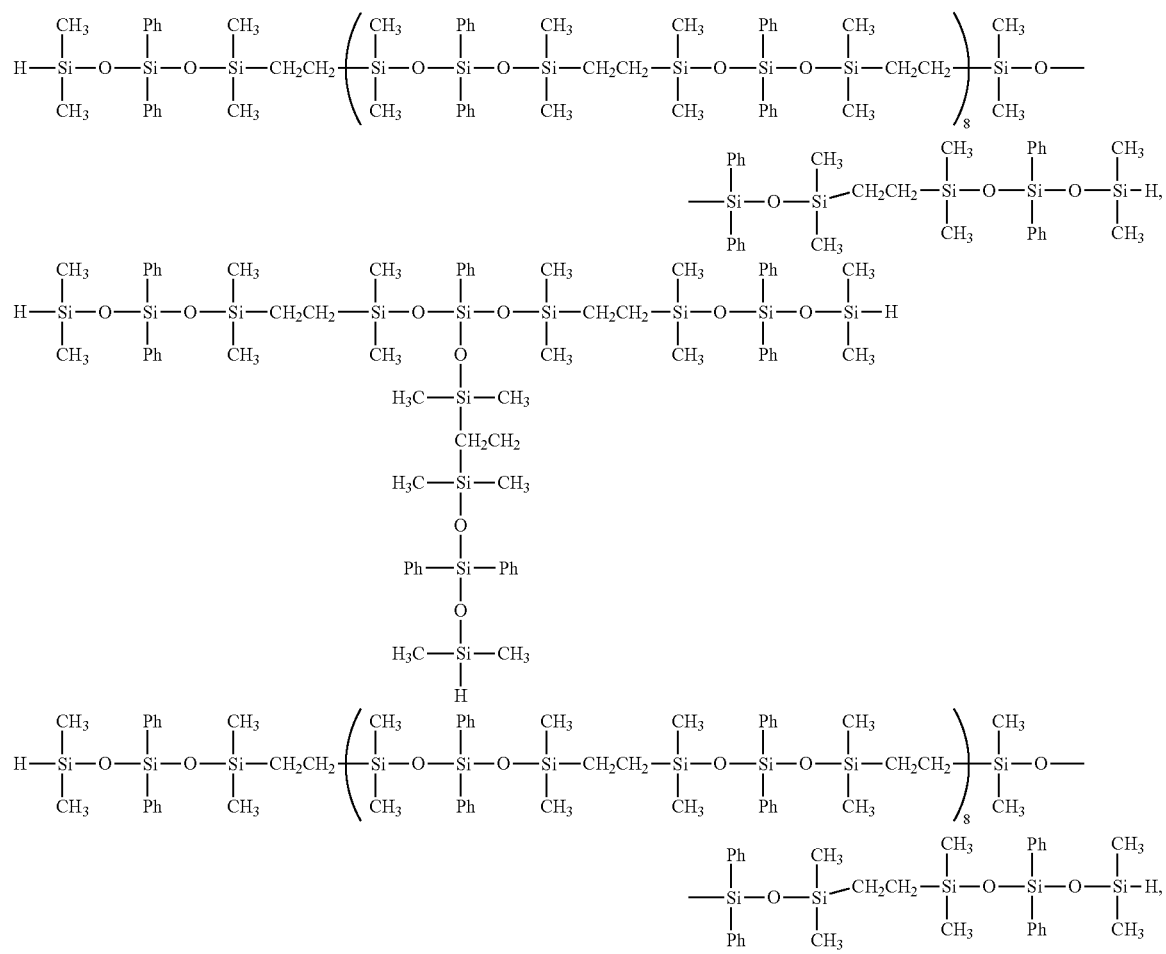

or a combination thereof.

Among the curable compositions of the invention, the amount of component (C) is about 1 part by weight to about 300 parts by weight, preferably about 10 parts by weight to about 250 parts by weight and more preferably about 12 parts by weight to about 180 parts by weight, based on 100 parts by weight of the total amount of components (A) and (B). If the amount of component (C) is lower than the lower limit of the suggested range, the composition may not be sufficiently cured; and if the amount of component (C) is higher than the upper limit of the suggested range, the heat resistance of the cured product of the composition tends to decrease.

Component (D) is a catalyst used to promote the curing of the composition, which catalyzes the reaction between the alkenyl groups of components (A) and (B) and the silicon-bonded H of component (C). The catalyst may be selected from the following group: Ni, Pt, Rh, Pd, compounds and complexes of the above, and combinations thereof, and is preferably a Pt catalyst. The embodiments of the Pt catalyst are, for example, Pt powders, chloroplatinic acid, an alcohol solution of chloroplatinic acid, Pt/alkenyl-siloxane complexes, Pt/alkene complexes and Pt/carbonyl complexes, wherein the Pt/alkenyl-siloxane complexes are preferred, such as Karstedt catalyst. Furthermore, there is no limitation to the amount of component (D) as long as component (D) can provide the desired promoting effect to the curing of the composition. Generally, the amount of component (D) is about 0.01 ppm to about 500 ppm, and preferably about 0.01 ppm to about 100 ppm, based on the mount of metal contained in component (D). If the amount of component (D) is lower than the lower limit of the suggested range, the catalyst cannot provide desired catalytic effect and the composition may not be sufficiently cured; and if the amount of component (D) is higher than the upper limit of the suggested range, the cured product of the composition may be provided with an undesired color.

In one embodiment of the invention, the composition of the invention may further comprise component (E). Preferably, component (E) is a branched organopolysiloxane consisting of $(R'')_3SiO_{1/2}$ and $R''SiO_{3/2}$ units. The addition of component (E) increases crosslinking density, so the cured product has superior anti-sulfuration ability.

In a preferable embodiment of the invention, component (E) is an organopolysiloxane capped with vinyl and/or methyl and has an average unit formula (VII):

$$(R''_3SiO_{1/2})_{p''}(R''SiO_{3/2})_{q''} \qquad (IX),$$

The polymer of component (E) is in liquid phase at room temperature (about 25° C.) and has a viscosity of 10 to 2000 mPa·S. R'' is defined as above and each of R'' is the same with or different from each other. In one embodiment of the invention, based on the total amount of all silicon-bonded organic functional groups (which indicates the total amount of R''), about 0 to about 35 mol % of R'' is $C_2$-$C_8$ alkenyl, preferably $C_1$-$C_3$ alkenyl or $C_2$-$C_4$ alkenyl; more preferably methyl or vinyl; and about 5 to about 35 mol % of R'' is aryl.

Moreover, the component (E) has a molecular weight ranging from 300 to 1500 and p'' and q'' preferably have following definitions:

p'' is an integer ranging from about 1 to about 30;
q'' is an integer ranging from about 1 to about 10; and
p'':q''=1.5:1 to 4:1.

In some embodiments, the component (E) can be selected from the following group:

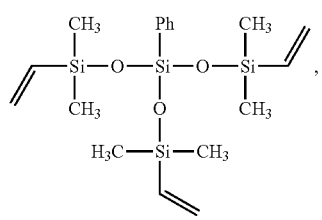

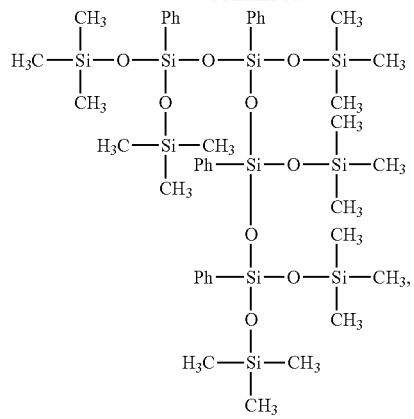

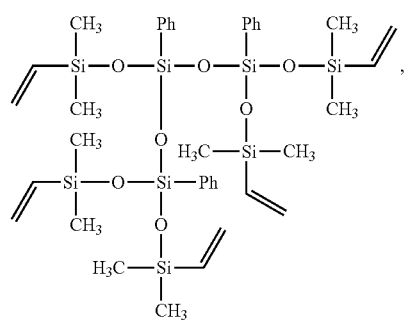

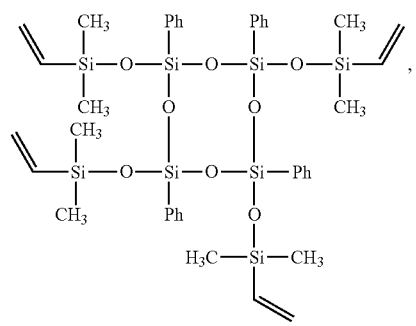

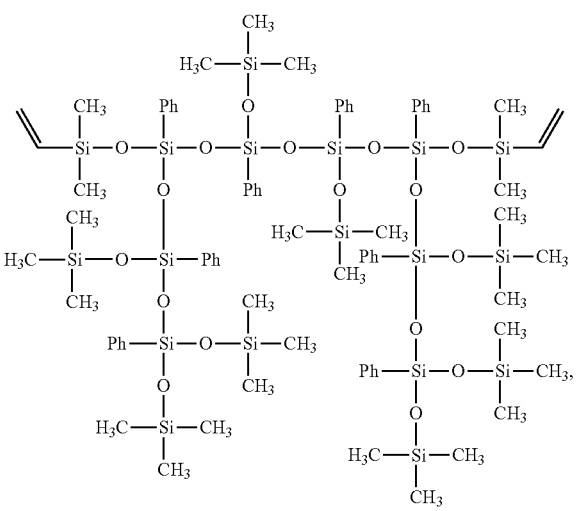

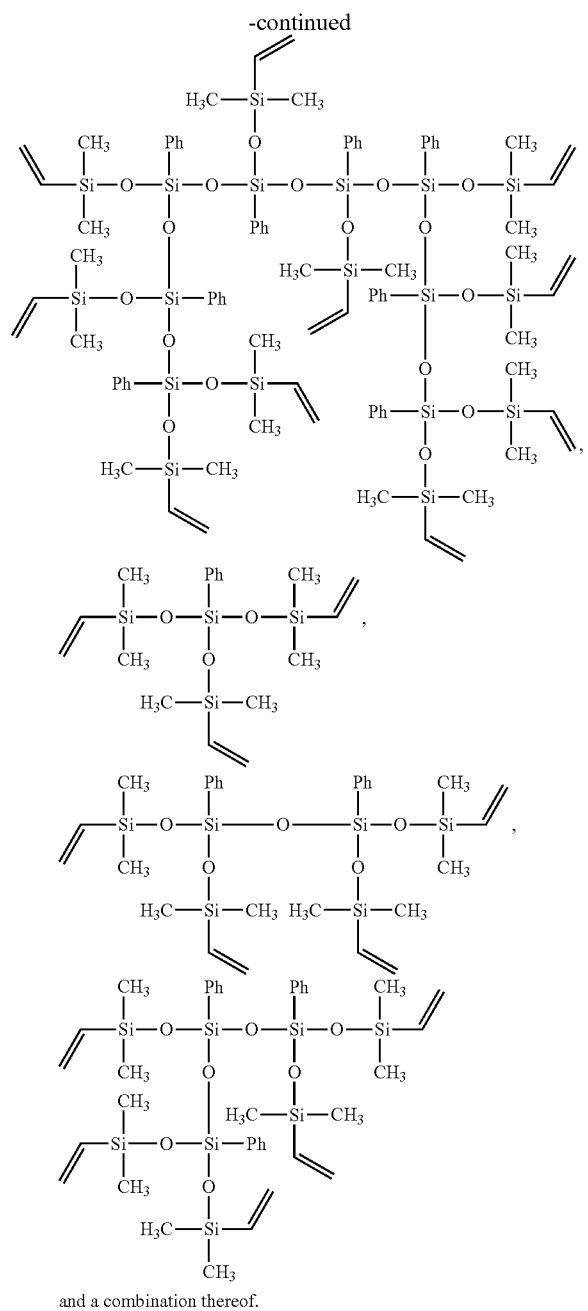

and a combination thereof.

Among the curable composition of the invention, the amount of component (E) is about 0 part by weight to about 20 parts by weight, preferably about 0.5 part by weight to about 15 parts by weight and more preferably about 1 part by weight to about 7 parts by weight, based on 100 parts by weight of components (B) and (C).

Furthermore, under the premise of not damaging the objective of the invention, other curing agents and/or additives (e.g., adhesion promoters, inorganic fillers, heat stabilizers, pigments, flame retardants, solvents, thermal initiator, photoinitiator or the like) may be added into the curable composition of the invention. The relevant disclosure and specific embodiments can refer to U.S. Pat. No. 7,527,871 B2, and the full content of which is incorporated herein for reference.

The curable composition of the invention has an appropriate refractive index (i.e. between 1.43 to 1.5), and good operation ability. The cured product has superior heat resistance, water resistance and gas resistance as well as an unsticky surface without yellowing. Thus, the curable composition of the invention is suitable for use as a packaging material for the devices, such as light emitting diodes or light sensors.

The curing methods used to cure the curable composition of the present invention are those known in the art, for example, but not limited to heat-curing or photo-curing.

The present invention further provides a method for manufacturing the aforementioned curable composition. The method comprises an addition reaction of a siloxane having at least two alkenyl groups and a siloxane having at least two H to provide component (A); and mixing component (A) with the above components (B), (C) and (D) and other desired additives. Persons of ordinary skill in the art can easily comprehend and carry out the method after reviewing the disclosure of the specification and there is no need to further describe the detailed process of the method here.

The present invention further relates to a semiconductor device comprising a semiconductor component and a layer encapsulating the semiconductor device, wherein the layer comprises a cured product of the foregoing curable composition. In a preferable aspect, the semiconductor component is light emitting diode or light sensor.

The present invention further relates to a phosphor package, which comprises a phosphor material and a silicone material, wherein the silicone material are a cured product of the aforementioned curable composition. The preparation of the phosphor package comprises, for example, but is not limited to, mixing one or more phosphor materials with the curable composition of the present invention; applying the mixture onto a surface of a substrate to be packaged; and curing the mixture, for example, by heat.

There is not special limitation to the phosphor materials used herein and can be, for example, but is not limited to, yellow phosphor material, which is able to convert blue light to yellow light; or other phosphor materials. There is no special limitation to the species of phosphor materials, which can be any suitable ones known by persons of ordinary skill in the art, for example, but is not limited to, the phosphor materials obtained by doping metal oxides, metal sulfides or the like with metal atoms such as Ce, Eu, Tb or the like.

Embodiments of the phosphor materials used herein include, for example, but is not limited to, garnet phosphor materials having a garnet crystal structure, such as $Y_3Al_5O_{12}$:Ce (YAG:Ce), $(Y,Gd)_3Al_5O_{12}$:Ce, $Tb_3Al_3O_{12}$:Ce, $Ca_3Sc_2Si_3O_{12}$:Ce and $Lu_2CaMg_2(Si,Ge)_3O_{12}$:Ce or the like; silicate phosphor materials, such as $(Sr,Ba)_2SiO_4$:Eu, $Ca_3SiO_4Cl_2$:Eu, $Sr_3SiO_5$:Eu, $Li_2SrSiO_4$:Eu and $Ca_3Si_2O_7$:Eu; aluminate phosphor materials, such as $CaAl_{12}O_{19}$:Mn, $SrAl_2O_4$:Eu or the like; sulfide phosphor materials, such as ZnS:Cu, Al (i.e., Cu and Al alloy doped in ZnS), CaS:Eu, $CaGa_2S_4$:Eu, $SrGa_2S_4$:Eu or the like; oxynitride phosphor materials, such as $CaSi_2O_2N_2$:Eu, $SrSi_2O_2N_2$:Eu, $BaSi_2O_2N_2$:Eu, Ca-α-SiAlON or the like; nitride phosphor materials, such as $CaAlSiN_3$:Eu, $CaSi_5N_8$:Eu or the like; fluoride phosphor materials, such as $K_2SiF_6$:Mr, $K_2TiF_6$:Mn or the like. The phosphor materials preferably is garnet phosphor materials, more preferably is $Y_3Al_5O_{12}$:Ce.

The phosphor materials are in particulate form and have an average particle size of, such as 0.1 µm to 30 µm, preferably 0.2 µm to 20 µm. The average particle size of the phosphor materials can be measured by a particle size distribution analyzer.

One species of phosphor material can be used alone or a combination of two or more species of phosphor materials can be used.

Based on 100 parts by weight of silicone material (i.e., 100 parts by weight of the curable composition; there is no substantial difference in weight before and after curing), the phosphor materials are 1 to 100 parts by weight, more preferably 5 to 40 parts by weight.

The present invention will be further illustrated by the embodiments hereinafter, wherein the measuring instruments and methods are respectively as follows:

<Viscosity>

The viscosity of the curable composition was measured according to ASTM D4287-94 using Brookfield HB viscometer equipped with CP51 spindle rotating at 0.6 rounds per minute (rpm) at 25° C.

<Refractive Index of the Cured Product>

The refractive index of the sample was measured by Abbe refractometer of ATAGO company (light source: a visible light with a wavelength of 589 nm) at 25° C.

<Transmittance of the Cured Product>

The transmittance of the sample was measured by Lambda 650 instrument of Perkin Elmer company (light source: a visible light with a wavelength of 450 nm; optical path length: about 1 mm).

<Hardness of the Cured Product>

The hardness of the sample was measured by Shore durometer (model no.: GS-720N and GS-709G) of the TECLOCK company.

<Water Resistance of the Cured Product>

The water resistance was measured using WVTR 361, Mocon, Inc.

<Gas Resistance of the Cured Product>

The gas resistance was measured using Mocon Oxtran 2/21, Mocon, Inc.

<Anti-Sulfuration>

Anti-sulfuration was measured using TITAN-SEMI Slim KIC-2000 (Test conditions including temperature: 50° C., relative humidity (RH): 75%, concentration of hydrogen sulfide: 3 ppm, input current: 20 mA). Light was detected after the sulfuration of the composition while light detected before the sulfuration serves as 100%.

EXAMPLES

Cured Product Test

Curable compositions 1 to 14 prepared by Examples 1 to 10 and Comparative examples 1 to 4 were placed in an oven with hot-air circulation, respectively, and pretreated at 80° C. for 1 hour. The temperature of the oven was then elevated to 150° C. and maintained for 4 hours and the cured products were obtained. The properties of the obtained cured products were measured by the above measuring method. The results were shown in Table 1 and Table 2.

[Component A]

A-1 Branched Polymer

[HSi(CH$_3$)$_2$O]$_2$SiPh$_2$, [CH$_2$=CHSi(CH$_3$)$_2$O]$_2$SiPh$_2$ and [CH$_2$=CHSi(CH$_3$)$_2$O]$_3$SiPh were mixed in a molar ratio of 6:6:1; a catalyst (Pt) was added into the resultant mixture; nitrogen was introduced and the temperature was elevated to 103° C. and kept for 6 hrs; and a product was obtained, which has following structure and a viscosity of 3,000-4,000 mPa·s (the viscosity was measured at 25° C.):

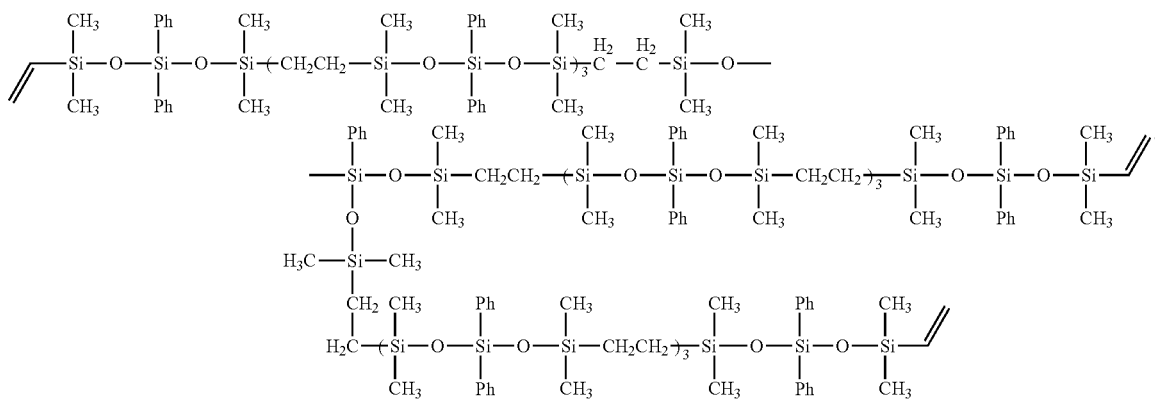

A-2 Branched Polymer

CH$_2$=CH(CH$_3$)$_2$SiOSi(CH$_3$)$_2$CH=CH$_2$, [HSi(CH$_3$)$_2$O]$_2$SiCH$_3$Ph and [CH$_2$=CHSi(CH$_3$)$_2$O]$_3$SiPh were mixed uniformly in a molar ratio of 21:21:1; a catalyst (Pt) was added into the resultant mixture; nitrogen was introduced and the temperature was elevated to 103° C. and kept for 6 hrs; and a product was obtained, which has following structure and a viscosity of 30-500 mPa·s (the viscosity was measured at 25° C.):

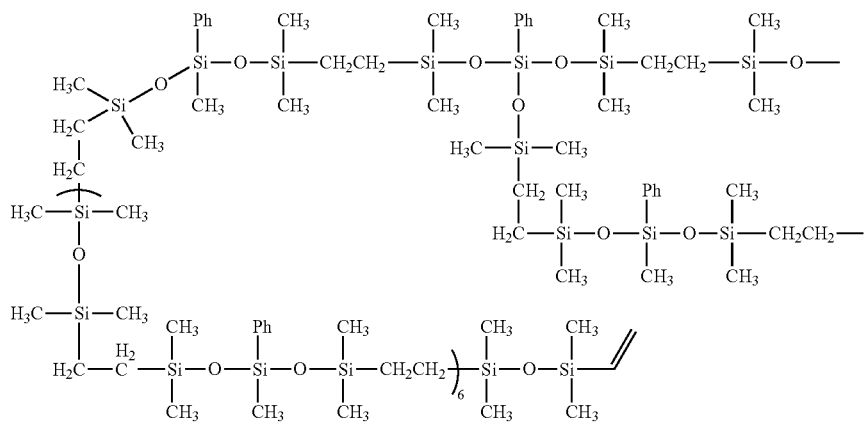

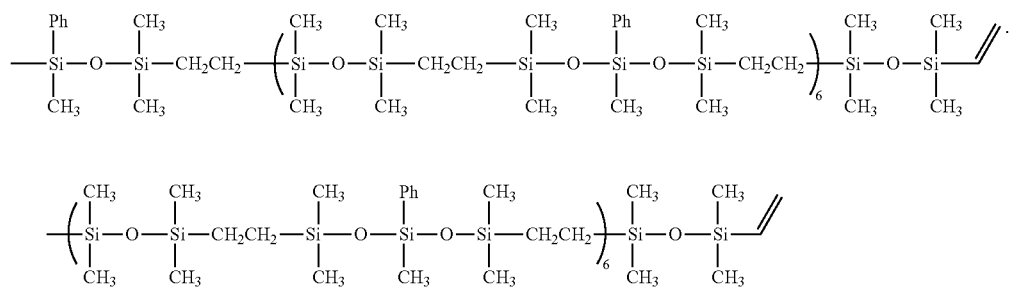

A-3 Linear Polymer

[CH$_2$=CHSi(CH$_3$)$_2$O]$_2$SiCH$_3$Ph and [HSi(CH$_3$)$_2$O]$_2$SiCH$_3$Ph were mixed in a molar ratio of 8:7; a catalyst (Pt) was added into the resultant mixture; nitrogen was introduced and the temperature was elevated to 103° C. and kept for 6 hrs; and a product was obtained, which has following structure and a viscosity of 5,000-6,000 mPa·s (the viscosity was measured at 25° C.):

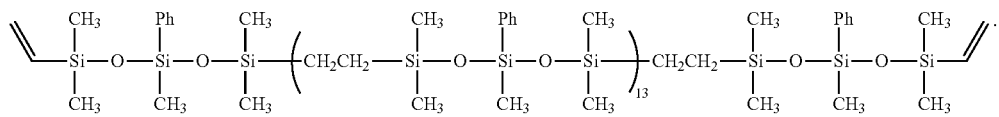

A-4 Branched Polymer

CH$_2$=CH(CH$_3$)$_2$SiOSi(CH$_3$)$_2$CH=CH$_2$, [HSi(CH$_3$)$_2$O]$_2$SiCH$_3$Ph, [CH$_2$=CHSi(CH$_3$)$_2$O]$_2$SiPh$_2$ and [CH$_2$=CHSi(CH$_3$)$_2$O]$_3$SiPh were mixed uniformly in a molar ratio of 6:9:3:1; a catalyst (Pt) was added into the resultant mixture; nitrogen was introduced and the temperature was elevated to 103° C. and kept for 6 hrs; and a product was obtained, which has following structure and a viscosity of 10-3000 mPa·s (the viscosity was measured at 25° C.):

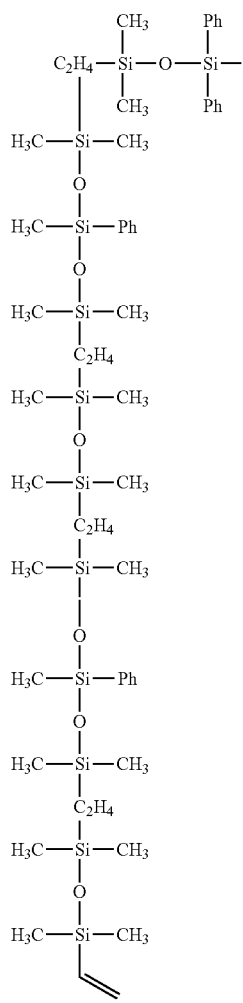
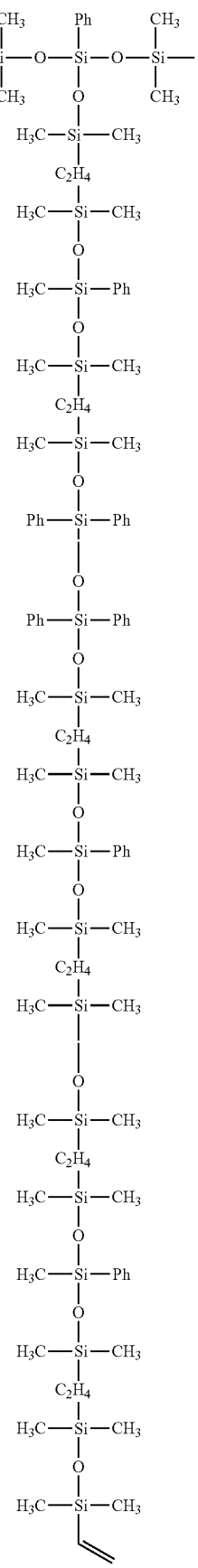

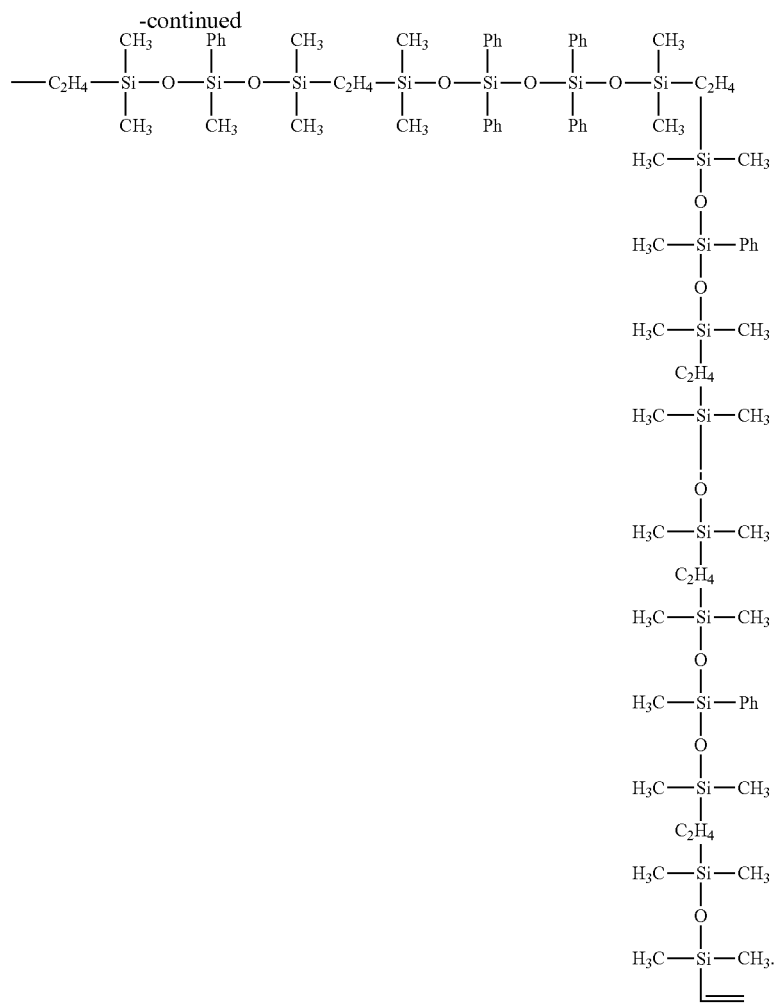

[Component B]

B-1 Branched Organopolysiloxane 0.5 mole of $CH_2=CH(CH_3)_2SiOSi(CH_3)_2CH=CH$ was mixed with 0.5 mole of $(CH_3)_3SiOSi(CH_3)_3$, 1.5 mole of $(CH_3CH_2O)_4Si$ and 1.5 mole of $(CH_3O)_3Si(C_6H_5)$ and HCl was added as a catalyst into the resultant mixture to carry out the reaction. After the reaction was completed, toluene and water were added and the product was neutralized after wash with water. Component (B-1) was obtained:

$(SiO_{4/2})_{0.3}(PhSiO_{3/2})_{0.3}[(CH_2=CH)(CH_3)_2SiO_{1/2}]_{0.2}[(CH_3)_3SiO_{1/2}]_{0.2}$.

B-2 Branched Organopolysiloxane 0.12 mole of $CH_2=CH(CH_3)_2SiOSi(CH_3)_2CH=CH_2$ was mixed with 1.08 mole of $(CH_3)_3SiOSi(CH_3)_3$, 1.5 mole of $(CH_3CH_2O)_4Si$ and 1.5 mole of $(CH_3O)_3Si(C_6H_5)$, and HCl was added as a catalyst into the resultant mixture to carry out the reaction. After the reaction was completed, toluene and water were added and the product was neutralized after wash with water. Component (B-2) was obtained:

$(SiO_{4/2})_{0.278}(PhSiO_{3/2})_{0.278}[(CH_2=CH)(CH_3)_2SiO_{1/2}]_{0.044}[(CH_3)_3SiO_{1/2}]_{0.4}$.

B-3 Branched Organopolysiloxane 1.6 mole of $CH_2=CH(CH_3)_2SiOSi(CH_3)_2CH=CH_2$ was mixed with 1.7 mole of $(CH_3CH_2O)_4Si$ and 5.2 mole of $(CH_3O)_3Si(C_6H_5)$ and HCl was added as a catalyst into the resultant mixture to carry out the reaction. After the reaction was completed, toluene and water were added and the product was neutralized after wash with water. Component (B-3) was obtained:

$(SiO_{4/2})_{0.168}(PhSiO_{3/2})_{0.515}[(CH_2=CH)(CH_3)_2SiO_{1/2}]_{0.317}$.

B-4 Branched Organopolysiloxane 0.44 mole of $CH_2=CH(CH_3)_2SiOSi(CH_3)_2CH=CH_2$ was mixed with 4 mole of $(CH_3)_3SiOSi(CH_3)_3$, 2.78 mole of $(CH_3CH_2O)_4Si$ and 2.78 mole of $(CH_3O)_3Si(C_6H_5)$ and HCl was added as a catalyst into the resultant mixture to carry out the reaction. After the reaction was completed, toluene and water were added and the product was neutralized after wash with water. Component (B-4) was obtained:

$(SiO_{4/2})_{0.193}(PhSiO_{3/2})_{0.193}[(CH_2=CH)(CH_3)_2SiO_{1/2}]_{0.06}[(CH_3)_3SiO_{1/2}]_{0.554}$.

B-5 Branched Organopolysiloxane (without $SiO_{4/2}$ Unit)

1.25 mol of $CH_2=CH(CH_3)_2SiOSi(CH_3)_2CH=CH_2$ and 10 mole of $(CH_3O)_3SiPh$ were mixed and HCl was added as a catalyst into the resultant mixture to carry out the reaction. After the reaction was completed, toluene and water were added and the product was neutralized after wash. Component (B-5) was obtained:

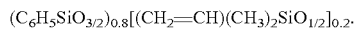

B-6 Branched Organopolysiloxane (without $R^4SiO_{3/2}$ Unit)

1.3 mol of $CH_2$=$CH(CH_3)_2SiOSi(CH_3)_2CH$=$CH_2$ was mixed with 0.8 mole of $(CH_3)_3SiOSi(CH_3)_3$ and 1 mole of $(CH_3CH_2O)_4Si$ and HCl was added as a catalyst into the resultant mixture to carry out the reaction. After the reaction was completed, toluene and water were added and the product was neutralized after wash with water. Component (B-6) was obtained:

[(CH$_2$=CH)(CH$_3$)$_2$SiO$_{1/2}$]$_{0.5}$[(CH$_3$)$_3$SiO$_{1/2}$]$_{0.31}$ (SiO$_{4/2}$)$_{0.19}$.

B-7 Branched Organopolysiloxane (x+y<0.35)

0.85 mole of $CH_2$=$CH(CH_3)_2SiOSi(CH_3)_2CH$=$CH_2$ was mixed with 2.02 mole of $(CH_3)_3SiOSi(CH_3)_3$, 1.5 mole of $(CH_3CH_2O)_4Si$ and 1.5 mole of $(CH_3O)_3SiPh$ and HCl was added as a catalyst into the resultant mixture to carry out the reaction. After the reaction was completed, toluene and water were added and the product was neutralized after wash. Component (B-7) was obtained:

(SiO$_{4/2}$)$_{0.172}$(PhSiO$_{3/2}$)$_{0.172}$[(CH$_2$=CH)(CH$_3$)$_2$SiO$_{1/2}$]$_{0.195}$[(CH$_3$)$_3$SiO$_{1/2}$]$_{0.461}$.

B-8 Branched Organopolysiloxane (x+y>0.7)

1.5 mole of $CH_2$=$CH(CH_3)_2SiOSi(CH_3)_2CH$=$CH_2$ was mixed with 5 mole of $(CH_3CH_2O)_4Si$ and 3.6 mole of $(CH_3O)_3Si(C_6H_5)$ and HCl was added as a catalyst into the resultant mixture to carry out the reaction. After the reaction was completed, toluene and water were added and the product was neutralized after wash. Component (B-8) was obtained:

(SiO$_{4/2}$)$_{0.431}$(PhSiO$_{3/2}$)$_{0.31}$[(CH$_2$=CH)(CH$_3$)$_2$SiO$_{1/2}$]$_{0.259}$.

[Component C]

C-1 Organopolysiloxane Capped with H

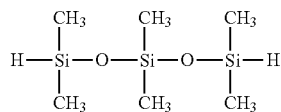

C-2 Organopolysiloxane Capped with H 2 mole of [H(CH$_3$)$_2$SiO]$_2$Si(CH$_3$)Ph, 1 mole of [CH$_2$=CHSi(CH$_3$)$_2$O]$_2$SiPh$_2$ and Pt catalyst were subsequently added into a reaction tank, the temperature was elevated to 103° C. and a reaction was conducted for 6 hrs to obtain Component C-2 with a viscosity of 100 to 300 mPa·s (the viscosity was measured at 25° C.):

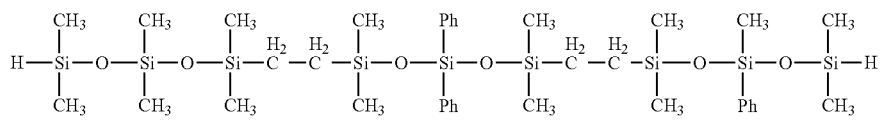

C-3 Organopolysiloxane Capped with H

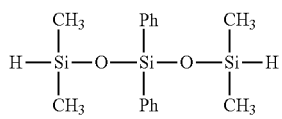

[Component E]

E-1 Branched Organopolysiloxane (Merely Including (R")$_3$SiO$_{1/2}$ and R"SiO$_{3/2}$ Units)

0.5 mole of $CH_2$=$CH(CH_3)_2SiOSi(CH_3)_2CH$=$CH_2$ and 4 mole of $(CH_3O)_3SiPh$ were mixed and HCl was added as a catalyst to carry out the reaction. Then, 3 mole of $CH_2$=$CH(CH_3)_2SiOSi(CH_3)_2CH$=$CH_2$ was added. After the reaction was completed, toluene and water were added. The product was washed with water until neutral. Vacuum distillation was conducted to remove toluene and residual $CH_2$=$CH(CH_3)_2SiOSi(CH_3)_2CH$=$CH_2$. Compound (E-1) having the following structure was obtained (molecular weight: 900-1,200):

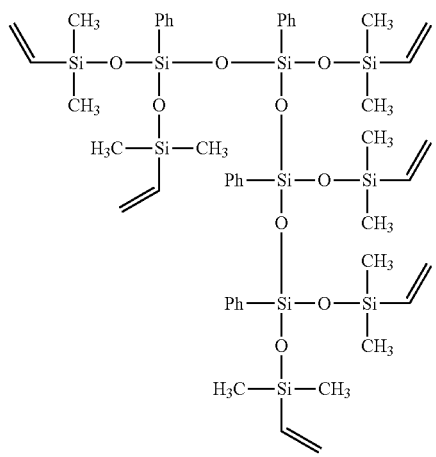 [SMILES: C=C[Si](C)(C)O[Si](O[Si](C)(C)C=C)(O[Si](O[Si](C)(C)C=C)(O[Si](O[Si](C)(C)C=C)(O[Si](O[Si](C)(C)C=C)(O[Si](C)(C)C=C)c1ccccc1)c1ccccc1)c1ccccc1)c1ccccc1]

formula E-1.

E-2 Branched Organopolysiloxane (Merely Including (R")$_3$SiO$_{1/2}$ and R"SiO$_{3/2}$ Units)

0.5 mole of $CH_2$=$CH(CH_3)_2SiOSi(CH_3)_2CH$=$CH_2$ and 4 mole of $(CH_3O)_3SiPh$ were mixed and HCl was added as a catalyst to carry out the reaction. Then, 3 mole of $(CH_3)_3SiOSi(CH_3)_3$ was added. After the reaction was completed, toluene and water were added. The product was washed with water until neutral. Vacuum distillation was conducted to remove toluene and residual $(CH_3)_3SiOSi(CH_3)_3$. Compound (E-2) having the following structure was obtained (molecular weight: 1,000~1,300):

formula E-2

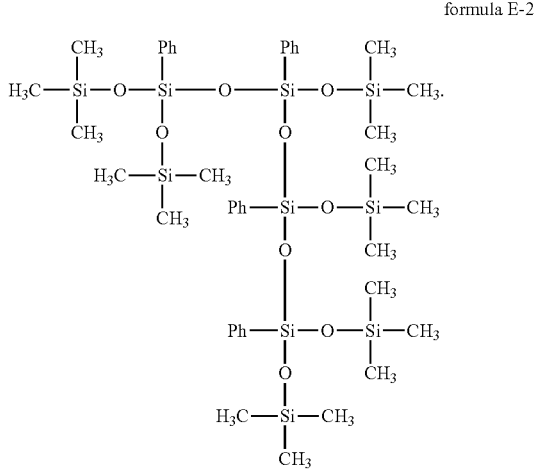 [SMILES: C[Si](C)(C)O[Si](O[Si](C)(C)C)(O[Si](O[Si](C)(C)C)(O[Si](O[Si](C)(C)C)(O[Si](O[Si](C)(C)C)(O[Si](C)(C)C)c1ccccc1)c1ccccc1)c1ccccc1)c1ccccc1]

E-3 Branched Organopolysiloxane (Merely Including $(R'')_3SiO_{1/2}$ and $R''SiO_{3/2}$ Units)

1.72 mole of $CH_2=CH(CH_3)_2SiOSi(CH_3)_2CH=CH_2$ and 1 mole of $(CH_3O)_3SiPh$ were mixed and HCl was added as a catalyst to carry out the reaction. After the reaction was completed, toluene and water were added. The product was washed with water until neutral. Vacuum distillation was conducted to remove toluene and residual $CH_2=CH(CH_3)_2SiOSi(CH_3)_2CH=CH_2$. A mixture including compounds of the following formulae E-3-1, E-3-2 and E-3-3 was obtained with a molar ratio of E-3-1, E-3-2 and E-3-3 being 1:2.5:1.8. The mixture had an average molecular weight of 350 to 950:

formula E-3-1

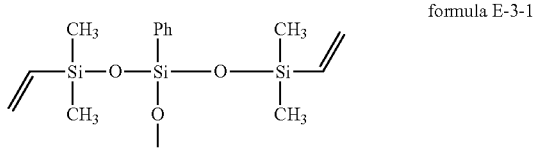

formula E-3-2

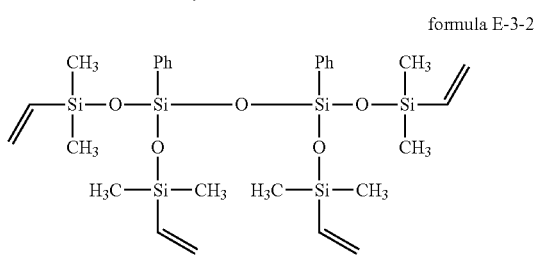

formula E-3-3

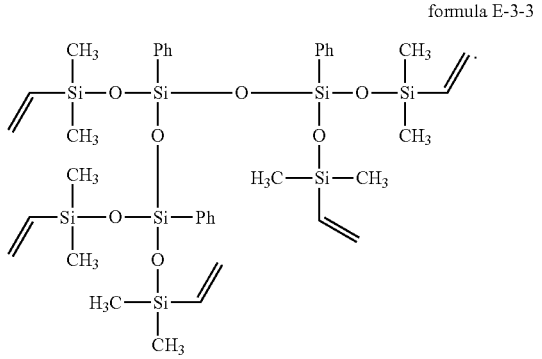

Example 1

The obtained component (A-1) was mixed uniformly with the following components with designated ratio to prepare a curable organopolysiloxane composition 1 (viscosity: 1,500 to 2,500 mPa·sec):

component (A-1): 30 parts by weight;
component (B-1): 52 parts by weight of the organopolysiloxane having the following structure and having an average molecular weight of 1,500 to 1,900:

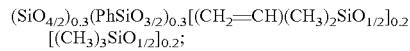

in which the content of the phenyl group is 20 mole % and the content of the vinyl group is 13.3 mole %, based on the total amount of all silicon-bonded organic functional groups;

component (C-1): 18 parts by weight of organopolysiloxane having the following structure:

component (D): a complex of Pt and 1,3-divinyl-1,1,3,3-tetramethoxyldisiloxane, used in an amount such that the concentration of Pt was about 1.5 ppm; and component (F): 0.05 parts by weight of 1-acetenyl-1-cyclohexanol for uniformly mixing the components.

Example 2

The obtained component (A-1) was mixed uniformly with the following components with designated ratio to prepare a curable organopolysiloxane composition 2 (viscosity: 1,300 to 1,500 mPa·sec):

component (A-1): 17 parts by weight;
component (B-2): 70 parts by weight of the organopolysiloxane having the following structure and having an average molecular weight of 1,500 to 1,900:

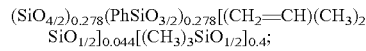

in which the content of the phenyl group is 17.3 mole % and the content of the vinyl group is 2.7 mole %, based on the total amount of all silicon-bonded organic functional groups;

component (C-1): 13 parts by weight of organopolysiloxane having the following structure:

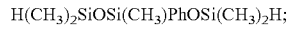

component (D): a complex of Pt and 1,3-divinyl-1,1,3,3-tetramethoxyldisiloxane, used in an amount such that the concentration of Pt was about 1.5 ppm; and component (F): 0.05 parts by weight of 1-acetenyl-1-cyclohexanol for uniformly mixing the components.

Example 3

The obtained component (A-1) was mixed uniformly with the following components with designated ratio to prepare a curable organopolysiloxane composition 3 (viscosity: 1,400 to 1,500 mPa·sec):

component (A-1): 20 parts by weight;
component (B-3): 60 parts by weight of the organopolysiloxane having the following structure and having an average molecular weight of 1,500 to 1,900:

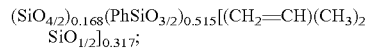

in which the content of the phenyl group is 35.1 mole % and the content of the vinyl group is 21.6 mole %, based on the total amount of all silicon-bonded organic functional groups;

component (C-1): 20 parts by weight of organopolysiloxane having the following structure:

$H(CH_3)_2SiOSi(CH_3)PhOSi(CH_3)_2H$;

component (D): a complex of Pt and 1,3-divinyl-1,1,3,3-tetramethoxyldisiloxane, used in an amount such that the concentration of Pt was about 1.5 ppm; and component (E): 3 parts by weight of E-1 branched organopolysiloxane and 3 parts by weight of E-2 branched organopolysiloxane component (F): 0.05 parts by weight of 1-acetenyl-1-cyclohexanol for uniformly mixing the components.

Example 4

The obtained component (A-1) was mixed uniformly with the following components with designated ratio to prepare a curable organopolysiloxane composition 4 (viscosity: 1,500 to 1,600 mPa·sec):
component (A-1): 12 parts by weight;
component (B-4): 80 parts by weight of the organopolysiloxane having the following structure and having an average molecular weight of 1,500 to 1,900:

$(SiO_{4/2})_{0.193}(PhSiO_{3/2})_{0.193}[(CH_2=CH)(CH_3)_2SiO_{1/2}]_{0.06}[(CH_3)_3SiO_{1/2}]_{0.554}$;

in which the content of the phenyl group is 9.5 mole % and the content of the vinyl group is 3 mole %, based on the total amount of all silicon-bonded organic functional groups;
component (C-1): 8 parts by weight of organopolysiloxane having the following structure:

$H(CH_3)_2SiOSi(CH_3)PhOSi(CH_3)_2H$;

component (D): a complex of Pt and 1,3-divinyl-1,1,3,3-tetramethoxyldisiloxane, used in an amount such that the concentration of Pt was about 1.5 ppm; and component (F): 0.05 parts by weight of 1-acetenyl-1-cyclohexanol for uniformly mixing the components.

Example 5

The obtained component (A-2) was mixed uniformly with the following components with designated ratio to prepare a curable organopolysiloxane composition 5 (viscosity: 1,400 to 1,500 mPa·sec):

$$H-\underset{CH_3}{\overset{CH_3}{Si}}-O-\underset{CH_3}{\overset{CH_3}{Si}}-O-\underset{CH_3}{\overset{CH_3}{Si}}-\overset{H_2}{C}-\overset{H_2}{C}-\underset{CH_3}{\overset{CH_3}{Si}}-O-\underset{Ph}{\overset{Ph}{Si}}-O-\underset{CH_3}{\overset{CH_3}{Si}}-\overset{H_2}{C}-\overset{H_2}{C}-\underset{CH_3}{\overset{CH_3}{Si}}-O-\underset{Ph}{\overset{CH_3}{Si}}-O-\underset{CH_3}{\overset{CH_3}{Si}}-H$$

component (A-2): 15 parts by weight;
component (B-1): 60 parts by weight of the organopolysiloxane having the following structure and having an average molecular weight of 1,500 to 1,900:

$(SiO_{4/2})_{0.3}(PhSiO_{3/2})_{0.3}[(CH_2=CH)(CH_3)_2SiO_{1/2}]_{0.2}[(CH_3)_3SiO_{1/2}]_{0.2}$;

in which the content of the phenyl group is 20 mole % and the content of the vinyl group is 13.3 mole %, based on the total amount of all silicon-bonded organic functional groups; component (C-1): 20 parts by weight of organopolysiloxane having the following structure:

$H(CH_3)_2SiOSi(CH_3)PhOSi(CH_3)_2H$;

component (D): a complex of Pt and 1,3-divinyl-1,1,3,3-tetramethoxyldisiloxane, used in an amount such that the concentration of Pt was about 1.5 ppm; and component (F): 0.05 parts by weight of 1-acetenyl-1-cyclohexanol for uniformly mixing the components.

Example 6

The obtained component (A-3) was mixed uniformly with the following components with designated ratio to prepare a curable organopolysiloxane composition 6 (viscosity: 1,400 to 1,500 mPa·sec):
component (A-3): 21 parts by weight;
component (B-1): 58 parts by weight of the organopolysiloxane having the following structure and having an average molecular weight of 1,500 to 1,900:

$(SiO_{4/2})_{0.3}(PhSiO_{3/2})_{0.3}[(CH_2=CH)(CH_3)_2SiO_{1/2}]_{0.2}[(CH_3)_3SiO_{1/2}]_{0.2}$;

in which the content of the phenyl group is 20 mole % and the content of the vinyl group is 13.3 mole %, based on the total amount of all silicon-bonded organic functional groups;
component (C-1): 19 parts by weight of organopolysiloxane having the following structure:

$H(CH_3)_2SiOSi(CH_3)PhOSi(CH_3)_2H$;

component (D): a complex of Pt and 1,3-divinyl-1,1,3,3-tetramethoxyldisiloxane, used in an amount such that the concentration of Pt was about 1.5 ppm; and component (F): 0.05 parts by weight of 1-acetenyl-1-cyclohexanol for uniformly mixing the components.

Example 7

The obtained component (A-1) was mixed uniformly with the following components with designated ratio to prepare a curable organopolysiloxane composition 7 (viscosity: 1,400 to 1,500 mPa·sec):
component (A-1): 20 parts by weight;
component (B-1): 50 parts by weight of the organopolysiloxane having the following structure and having an average molecular weight of 1,500 to 1,900:

$(SiO_{4/2})_{0.3}(PhSiO_{3/2})_{0.3}[(CH_2=CH)(CH_3)_2SiO_{1/2}]_{0.2}[(CH_3)_3SiO_{1/2}]_{0.2}$;

in which the content of the phenyl group is 20 mole % and the content of the vinyl group is 13.3 mole %, based on the total amount of all silicon-bonded organic functional groups;
component (C-2): 25 parts by weight of organopolysiloxane having the following structure:

component (D): a complex of Pt and 1,3-divinyl-1,1,3,3-tetramethoxyldisiloxane, used in an amount such that the concentration of Pt was about 1.5 ppm; and component (F): 0.05 parts by weight of 1-acetenyl-1-cyclohexanol for uniformly mixing the components.

Example 8

The obtained component (A-4) was mixed uniformly with the following components with designated ratio to prepare a curable organopolysiloxane composition 8 (viscosity: 10 to 3,000 mPa·sec):

component (A-4): 10 parts by weight;
component (B-1): 75 parts by weight of the organopolysiloxane having the following structure and having an average molecular weight of 1,500 to 1,900:

$(SiO_{4/2})_{0.3}(PhSiO_{3/2})_{0.3}[(CH_2=CH)(CH_3)_2SiO_{1/2}]_{0.2}$
$[(CH_3)_3SiO_{1/2}]_{0.2}$;

in which the content of the phenyl group is 20 mole % and the content of the vinyl group is 13.3 mole %, based on the total amount of all silicon-bonded organic functional groups;
component (C-1): 15 parts by weight of organopolysiloxane having the following structure:

$H(CH_3)_2SiOSi(CH_3)PhOSi(CH_3)_2H$;

component (C-3): 5 parts by weight of organopolysiloxane having the following structure:

$H(CH_3)_2SiOSiPh_2OSi(CH_3)_2H$ component (D): a complex of Pt and 1,3-divinyl-1,1,3,3-tetramethoxyldisiloxane, used in an amount such that the concentration of Pt was about 1.5 ppm;
component (E): 5 parts by weight of E-3 branched organopolysiloxane; and
component (F): 0.2 parts by weight of 1-acetenyl-1-cyclohexanol for uniformly mixing the components;

Example 9

The obtained component (A-1) was mixed uniformly with the following components with designated ratio to prepare a curable organopolysiloxane composition 9 (viscosity: 5,000 to 6,500 mPa·sec):
component (A-1): 24 parts by weight;
component (B-1): 41.6 parts by weight of the organopolysiloxane having the following structure and having an average molecular weight of 1,500 to 1,900:

$(SiO_{4/2})_{0.3}(PhSiO_{3/2})_{0.3}[(CH_2=CH)(CH_3)_2SiO_{1/2}]_{0.2}$
$[(CH_3)_3SiO_{1/2}]_{0.2}$;

in which the content of the phenyl group is 20 mole % and the content of the vinyl group is 13.3 mole %, based on the total amount of all silicon-bonded organic functional groups;
component (C-1): 14.4 parts by weight of organopolysiloxane having the following structure:

$H(CH_3)_2SiOSi(CH_3)PhOSi(CH_3)_2H$;

component (D): a complex of Pt and 1,3-divinyl-1,1,3,3-tetramethoxyldisiloxane, used in an amount such that the concentration of Pt was about 1.5 ppm; and
component (F): 0.05 parts by weight of 1-acetenyl-1-cyclohexanol for uniformly mixing the components;
component (G): 20 parts by weight of Chimei $Y_3Al_4O_{12}$ phosphor powder.

Example 10

The obtained component (A-1) was mixed uniformly with the following components with designated ratio to prepare a curable organopolysiloxane composition 10 (viscosity: 5,000 to 6,500 mPa·sec):
component (A-1): 16 parts by weight;
component (B-3): 48 parts by weight of the organopolysiloxane having the following structure and having an average molecular weight of 1,500 to 1,900:

$(SiO_{4/2})_{0.168}(PhSiO_{3/2})_{0.515}[(CH_2=CH)(CH_3)_2$
$SiO_{1/2}]_{0.317}$;

in which the content of the phenyl group is 35.1 mole % and the content of the vinyl group is 21.6 mole %, based on the total amount of all silicon-bonded organic functional groups;
component (C-1): 16 parts by weight of organopolysiloxane having the following structure:

$H(CH_3)_2SiOSi(CH_3)PhOSi(CH_3)_2H$;

component (D): a complex of Pt and 1,3-divinyl-1,1,3,3-tetramethoxyldisiloxane, used in an amount such that the concentration of Pt was about 1.5 ppm; and
component (F): 0.05 parts by weight of 1-acetenyl-1-cyclohexanol for uniformly mixing the components;
component (G): 20 parts by weight of Chimei $Y_3Al_4O_{12}$ phosphor powder.

Comparative Example 1

The obtained component (A-1) was mixed uniformly with the following components to prepare a curable organopolysiloxane composition 11 (viscosity: 3,000 to 4,000 mPa·sec):
component (A-1): 13 parts by weight;
component (B-5): 60 parts by weight of the organopolysiloxane (solid at 25° C.) having the following structure and having an average molecular weight of 1,729 to 1,900:

$(C_6H_5SiO_{3/2})_{0.8}[(CH_2=CH)(CH_3)_2SiO_{1/2}]_{0.2}$;

in which the content of the phenyl group is 57.1 mole % and the content of the vinyl group is 14.3 mole %, based on the total amount of all silicon-bonded organic functional groups;
component (C-1): 23 parts by weight of organopolysiloxane having the following structure:

$H(CH_3)_2SiOSi(CH_3)PhOSi(CH_3)_2H$;

component (D): a complex of Pt and 1,3-divinyl-1,1,3,3-tetramethoxyldisiloxane, used in an amount such that the concentration of Pt was about 1.5 ppm; and
component (F): 0.05 parts by weight of 1-acetenyl-1-cyclohexanol for uniformly mixing the components.

Comparative Example 2

The obtained component (A-1) was mixed uniformly with the following components to prepare a curable organopolysiloxane composition 12 (viscosity: 5,000 to 5,500 mPa·sec):
component (A-1): 43 parts by weight;
component (B-6): 53 parts by weight of the organopolysiloxane (solid at 25° C.) having the following structure and having an average molecular weight of 1,500 to 1,900:

$[(CH_2=CH)(CH_3)_2SiO_{1/2}]_{0.5}[(CH_3)_3SiO_{1/2}]_{0.31}$
$(SiO_{4/2})_{0.19}$;

in which the content of the phenyl group is 0 mole % and the content of the vinyl group is 21 mole %, based on the total amount of all silicon-bonded organic functional groups;
component (C-1): 4 parts by weight of organopolysiloxane having the following structure:

$H(CH_3)_2SiOSi(CH_3)PhOSi(CH_3)_2H$;

component (D): a complex of Pt and 1,3-divinyl-1,1,3,3-tetramethoxyldisiloxane, used in an amount such that the concentration of Pt was about 1.5 ppm; and
component (F): 0.05 parts by weight of 1-acetenyl-1-cyclohexanol for uniformly mixing the components.

Comparative Example 3

The obtained component (A-1) was mixed uniformly with the following components to prepare a curable organopolysiloxane composition 13 (viscosity: 300 to 1,000 mPa·sec):

component (A-1): 40 parts by weight;
component (B-7): 37 parts by weight of the organopolysiloxane having the following structure and having an average molecular weight of 1,000 to 1,500:

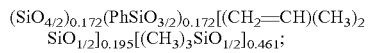
$(SiO_{4/2})_{0.172}(PhSiO_{3/2})_{0.172}[(CH_2=CH)(CH_3)_2SiO_{1/2}]_{0.195}[(CH_3)_3SiO_{1/2}]_{0.461};$ in which the content of the phenyl group is 28.5 mole % and the content of the vinyl group is 23.8 mole %, based on the total amount of all silicon-bonded organic functional groups;
component (C-1): 23 parts by weight of organopolysiloxane having the following structure:

$H(CH_3)_2SiOSi(CH_3)PhOSi(CH_3)_2H;$ component (D): a complex of Pt and 1,3-divinyl-1,1,3,3-tetramethoxyldisiloxane, used in an amount such that the concentration of Pt was about 1.5 ppm; and
component (F): 0.05 parts by weight of 1-acetenyl-1-cyclohexanol for uniformly mixing the components.

Comparative Example 4

The obtained component (A-1) was mixed uniformly with the following components to prepare a curable organopolysiloxane composition 14 (viscosity: 3000 to 4000 mPa·sec):
component (A-1): 30 parts by weight;
component (B-8): 53 parts by weight of the organopolysiloxane (solid at 25° C.) having the following structure and having an average molecular weight of 8,100 to 9,300:

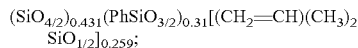
$(SiO_{4/2})_{0.431}(PhSiO_{3/2})_{0.31}[(CH_2=CH)(CH_3)_2SiO_{1/2}]_{0.259};$ in which the content of the phenyl group is 28.5 mole % and the content of the vinyl group is 23.8 mole %, based on the total amount of all silicon-bonded organic functional groups;
component (C-1): 17 parts by weight of organopolysiloxane having the following structure:

$H(CH_3)_2SiOSi(CH_3)PhOSi(CH_3)_2H;$ component (D): a complex of Pt and 1,3-divinyl-1,1,3,3-tetramethoxyldisiloxane, used in an amount such that the concentration of Pt was about 1.5 ppm; and
component (F): 0.05 parts by weight of 1-acetenyl-1-cyclohexanol for uniformly mixing the components.

[Results]

As shown in Tables 1 and 2, it is clear that the cured products of the compositions according to the invention (Examples 1 to 8) have unsticky surfaces and have superior heat resistance. Moreover, the cured products according to the invention have superior water resistance and gas resistance and can avoid sulfuration. Component (E) was additionally added in Examples 3 and 8. The results show that the addition of component (E) improves the anti-sulfuration ability of the cured products.

Component (B) of the composition of Comparative Example 1 does not contain $SiO_{4/2}$ units (i.e. y is 0). The cured product has a refractive index larger than 1.5, but has inferior heat resistance and thus cannot be used in the preparation process of semiconductors, which requires high temperature. Component (B) of the composition of Comparative Example 2 does not contain $R^4SiO_{3/2}$ units (i.e. x is 0). The cured product has poor water resistance and poor gas resistance and cannot effectively avoid sulfuration. The total amount of $R^4SiO_{3/2}$ unit and $SiO_{4/2}$ unit in the component (B) of the composition of Comparative Example 3 is lower than the lower limit of the suggested range according to the invention (i.e., in Comparative Example 3, x+y<0.35). The cured product has a sticky surface and inferior heat resistance and cannot effectively avoid sulfuration. The total amount of $R^4SiO_{3/2}$ unit and $SiO_{4/2}$ unit in the component (B) of the composition of Comparative Example 4 is larger than the upper limit of the suggested range according to the invention (i.e., in Comparative Example 4, x+y>0.7) The cured product has a sticky surface, poor applicability and poor operation ability (Generally, a cured product with a sticky surface means that the product cannot be sufficiently cured and thus it would be considered impracticable).

Examples 9 and 10 have similar compositions with Examples 1 and 3 but additionally contain phosphor powders. Because the addition of the phosphor powders results in poor heat dissipation, it is easy for the cured product to crack on its surface when exposed to high temperature (for example, 200° C.). To the contrary, the results of Examples 9 and 10 show that when the composition of the invention contains phosphor powders, the cured products still have unsticky surfaces and retain superior water and gas resistances and do not crack on the surface when exposed to high temperature (for example, heated at 200° C. for 72 hours). Therefore, they have good heat resistance.

TABLE 1

| | Ex. 1 | Ex. 2 | Ex. 3 | Ex. 4 | Ex. 5 | Ex. 6 | Ex. 7 | Ex. 8 | Ex. 9 (including phosphor powder) | Ex. 10 (including phosphor powder) |
|---|---|---|---|---|---|---|---|---|---|---|
| refractive index | 1.49 | 1.47 | 1.49 | 1.43 | 1.48 | 1.49 | 1.5 | 1.47 | — | — |
| appearance | transparent | transparent | transparent | transparent | transparent | transparent | transparent | transparent | yellow | yellow |
| transmittance | 98% | 98% | 98% | 98% | 98% | 98% | 98% | 98% | — | — |
| Shore hardness | 72 | 80 | 83 | 66 | 75 | 62 | 63 | 78 | 70 | 83 |
| surface stickiness | unsticky | unsticky | unsticky | unsticky | unsticky | unsticky | unsticky | unsticky | unsticky | unsticky |
| heat resistance | 96% | 96% | 95% | 96% | 96% | 96% | 95% | 96% | — | — |
| water resistance (mg/mm²-day) | 8 | 9 | 8 | 17 | 12 | 9 | 8 | 8 | 8 | 8 |
| gas resistance (cc/mm²-day) | 11 | 12 | 11 | 20 | 14 | 12 | 11 | 11 | 11 | 11 |
| anti-sulfuration | 95.4% | 95.1% | 97.6% | 91.4% | 96.1% | 93.5% | 94.2% | 98% | — | — |
| Appearance (before heated) | no cracks | no cracks | no cracks | no cracks | no cracks | no cracks | no cracks | no cracks | no cracks | no cracks |

TABLE 1-continued

|  | Ex. 1 | Ex. 2 | Ex. 3 | Ex. 4 | Ex. 5 | Ex. 6 | Ex. 7 | Ex. 8 | Ex. 9 (including phosphor powder) | Ex. 10 (including phosphor powder) |
|---|---|---|---|---|---|---|---|---|---|---|
| Appearance (heated at 200° C. for 72 hr) | no cracks | no cracks | no cracks | no cracks | no cracks | no cracks | no cracks | no cracks | no cracks | no cracks |

Heat resistance: evaluated based on the transmittance detected after the sample was heated at 200° C. for 72 hours. Yellowing occurred when transmittance is lower than 95%, which results in poor heat resistance.
Stickiness: tested by hand-touch.

TABLE 2

|  | Comp. Ex. 1 | Comp. Ex. 2 | Comp. Ex. 3 | Comp. Ex. 4 |
|---|---|---|---|---|
| refractive index | 1.53 | 1.41 | 1.47 | 1.48 |
| appearance | transparent | transparent | transparent but slightly cloudy | transparent |
| transmission | 98% | 98% | 92% | 97% |
| Shore hardness | 85 | 70 | 85 | 70 |
| stickiness of the surface | unsticky | unsticky | sticky | sticky |
| heat resistance | 92% | 97% | 90% | 95% |
| water resistance (mg/mm²-day) | 7 | 44 | 9 | 9 |
| gas resistance (cc/mm²-day) | 10 | 78 | 11 cc/mm²-day | 9 |
| anti-sulfuration | 99.5% | 87.4% | 89.7% | 92.3% |

Heat resistance: evaluated based on the transmittance detected after the sample was heated at 200° C. for 72 hours. Yellowing occurred when transmittance is lower than 95%, which results in poor heat resistance.
Stickiness: tested by hand-touch.

The above disclosure is related to the detailed technical contents and inventive features thereof. Persons of ordinary skill in the art may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A curable composition comprising:
(A) a polymer having an average unit formula (I'):

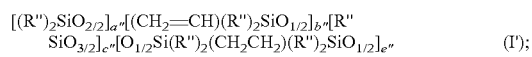
(I')

wherein R" is a substituted or unsubstituted mono-valent hydrocarbon group and each of R" is the same with or different from each other; a" is an integer ranging from 0 to 400; b" is an integer ranging from 2 to 6; c" is an integer ranging from 0 to 4, and e" is an integer ranging from 2 to 400;

(B) a branched organopolysiloxane having an average unit formula (VI):

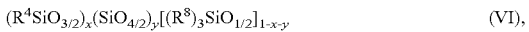
(VI), wherein $R^4$ is a substituted or unsubstituted mono-valent hydrocarbon group and each of $R^4$ is the same with or different from each other; $R^8$ is a substituted or unsubstituted mono-valent hydrocarbon group and each of $R^8$ is the same with or different from each other; x>0, y>0 and x+y is from about 0.35 to about 0.7, wherein about 0.1 mol % to about 40 mol % of $R^8$ is $C_2$-$C_8$ alkenyl, based on the total weight of all silicon-bonded organic functional groups; and wherein the amount of component (B) is about 1 part by weight to about 9,900 parts by weight, based on 100 parts by weight of component (A);

(C) an organopolysiloxane having an average unit formula (II) being capped with H:

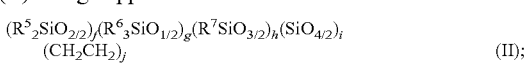
(II);

wherein $R^5$, $R^6$ and $R^7$ are independently H or a substituted or unsubstituted mono-valent hydrocarbon group and each of $R^5$ is the same or different from each other, each of $R^6$ is the same or different from each other, f>0, g>0, h≥0, i≥0, j≥0, and the amount of component (C) is about 1 parts by weight to about 250 parts by weight, based on 100 parts by weight of the total amount of components (A) and (B); and (D) a catalyst.

2. The curable composition of claim 1, wherein the polymer of the component (A) is in liquid phase at room temperature and has a viscosity of 10 to 100,000 mPa·s.

3. The curable composition of claim 1, wherein R" is $C_1$-$C_3$ alkyl or aryl.

4. The curable composition of claim 1, wherein R" is methyl or phenyl.

5. The curable composition of claim 1, wherein the component (A) is selected from:

(I'-1)

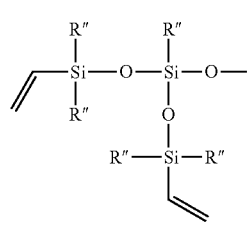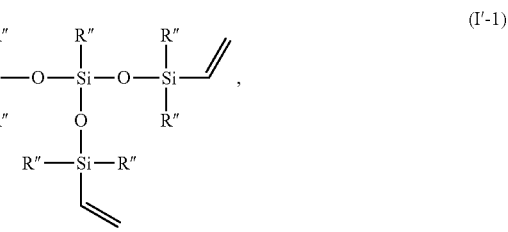

-continued

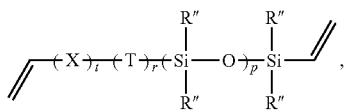 (I'-2)

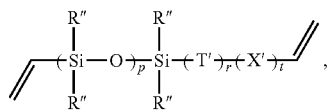 (I'-3)

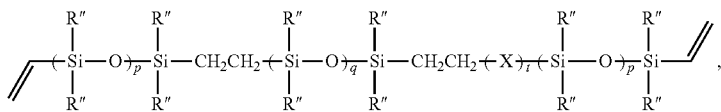 (I'-4)

and a combination thereof,
wherein
the repeated units, X, T, X' and T' are distributed in a random manner or in an alternative manner and each of X, T, X' and T' is independent and has the same or different definition;

X is

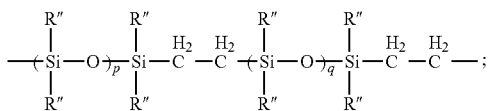

X' is

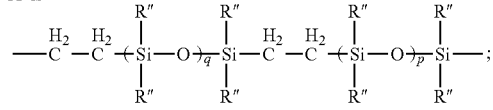

T is

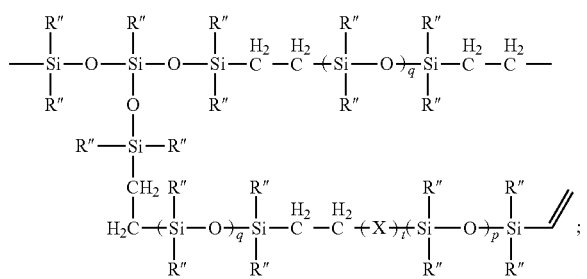

T' is

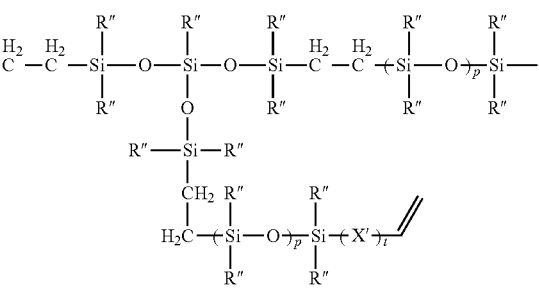

R" is as defined in claim 1;

p is an integer ranging from 1 to 4 and each of p is the same with or different from each other;

q is an integer ranging from 1 to 4 and each of q is the same with or different from each other;

r is an integer ranging from 1 to 3 and each of r is the same with or different from each other; and t is an integer ranging from 0 to 50 and each of t is the same with or different from each other.

6. The curable composition of claim 5, wherein r is 1.

7. The curable composition of claim 1, wherein about 0 to about 30 mol % of R" is aryl based on the total amount of R".

8. The curable composition of claim 7, wherein the component (A) has the following formula:

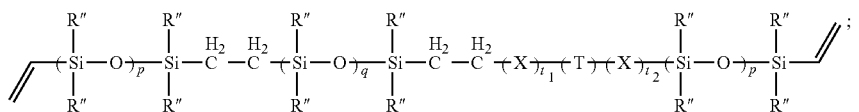

wherein X, T, R", p and q are as defined in claim 5, $t_1$ and $t_2$ are independently an integer ranging from 0 to 30 and $t_1+t_2$ is an integer ranging from 0 to 50.

9. The curable composition of claim 1, wherein the component (A) is prepared by an addition reaction.

10. The curable composition of claim 1, wherein $R^4$ is $C_1$-$C_3$ alkyl, $C_2$-$C_4$ alkenyl, aryl, arylalkyl or haloalkyl.

11. The curable composition of claim 10, wherein about 3 mol % to about 50 mol % of $R^4$ is aryl, based on the total weight of all silicon-bonded organic functional groups.

12. The curable composition of claim 1, wherein $R^4$ is phenyl, methyl or vinyl.

13. The curable composition of claim 1, wherein $R^8$ is aryl, $C_1$-$C_3$ alkyl or $C_2$-$C_4$ alkenyl.

14. The curable composition of claim 1, wherein $R^8$ is phenyl, methyl or vinyl.

15. The curable composition of claim 1, wherein x:y is from about 1:0.3 to about 1:1.5.

16. The curable composition of claim 1, wherein component (B) has at least one silicon-bonded alkenyl group and at least one silicon-bonded aryl group.

17. The curable composition of claim 1, wherein component (B) has an average unit formula (VII):

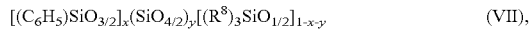  (VII), wherein $R^8$ is $C_1$-$C_8$ alkyl or $C_2$-$C_8$ alkenyl and each of $R^8$ is the same with or different from each other; x>0, y>0 and x+y is from about 0.35 to about 0.7; and wherein about 2 mol % to about 30 mol % of $R^8$ is $C_2$-$C_8$ alkenyl, based on the total weight of all silicon-bonded organic functional groups.

18. The curable composition of claim 17, wherein $R^8$ is $C_1$-$C_3$ alkyl or $C_2$-$C_4$ alkenyl.

19. The curable composition of claim 17, wherein $R^8$ is methyl or vinyl.

20. The curable composition of claim 1, wherein the amount of component (B) is about 200 parts by weight to about 3000 parts by weight, based on 100 parts by weight of component (A).

21. The curable composition of claim 1, wherein the amount of component (B) is about 300 parts by weight to about 2500 parts by weight, based on 100 parts by weight of component (A).

22. The curable composition of claim 1, wherein about 0.1 mole % to about 50 mole % of $R^5$, $R^6$ and $R^7$ are H, and at least about 5 mole % of $R^5$, $R^6$ and $R^7$ are aryl groups, based on the total amount of $R^5$, $R^6$ and $R^7$.

23. The curable composition of claim 1, wherein:
f is an integer ranging from about 1 to about 50;
g is an integer ranging from about 1 to about 50;
h is an integer ranging from 0 to about 10;
i is an integer ranging from 0 to about 5; and
j is an integer ranging from 0 to about 30.

24. The curable composition of claim 1, wherein the amount of component (C) is about 10 parts by weight to about 250 parts by weight, based on 100 parts by weight of the total amount of components (A) and (B).

25. The curable composition of claim 1, wherein the amount of component (C) is about 12 parts by weight to about 180 parts by weight, based on 100 parts by weight of the total amount of components (A) and (B).

26. The curable composition of claim 1, further comprising component (E), which is a branched organopolysiloxane consisting of $(R")_3SiO_{1/2}$ and $R"SiO_{3/2}$ units.

27. The curable composition of claim 26, wherein the component (E) has an average unit formula (IX) and is capped with vinyl or methyl:

  (IX), wherein R" is a substituted or unsubstituted mono-valent hydrocarbon group and each of R" is the same with or different from each other; p" is an integer ranging from about 1 to about 30; q" is an integer ranging from about 1 to about 10; and the mole ratio of p":q" is 1.5:1 to 4:1.

28. A method comprising packaging an electronic component with the curable composition of claim 1.

29. A semiconductor device, comprising a semiconductor component and a layer encapsulating the semiconductor component, wherein the layer comprises a cured product of the curable composition of claim 1.

30. The semiconductor device according to claim 29, wherein the semiconductor component is light emitting diode or light sensor.

31. A phosphor package, comprising a phosphor material and a silicone material, wherein the silicone material is a cured product of the curable composition of claim 1.

* * * * *